United States Patent [19]
Chung et al.

[11] Patent Number: 5,432,714
[45] Date of Patent: Jul. 11, 1995

[54] SYSTEM AND METHOD FOR PREPARING SHAPE DATA FOR PROXIMITY CORRECTION

[75] Inventors: Virginia M. Chung, Pleasant Valley; Joseph B. Frei; James E. Stuart, both of Hopewell Junction, all of N.Y.

[73] Assignee: International Business Machines Corporation, Armonk, N.Y.

[21] Appl. No.: 298,971

[22] Filed: Sep. 2, 1994

Related U.S. Application Data

[63] Continuation of Ser. No. 10,715, Jan. 29, 1993, abandoned.

[51] Int. Cl.⁶ .................. G06F 15/00; G02B 27/00
[52] U.S. Cl. ................... 364/525; 364/488; 364/489; 364/490; 250/492.2; 430/30; 430/296
[58] Field of Search ............. 364/488, 489, 490, 525; 250/492.2, 492.3; 430/296, 30, 5; 264/22

[56] References Cited

U.S. PATENT DOCUMENTS

| | | | |
|---|---|---|---|
| 4,099,062 | 7/1978 | Kitcher | 250/492 A |
| 4,426,584 | 1/1984 | Bohlen et al. | 250/492.2 |
| 4,482,810 | 11/1984 | Cooke | 250/492.2 |
| 4,500,789 | 2/1985 | Ban et al. | 250/492.2 |
| 4,504,558 | 3/1985 | Bohlen et al. | 430/30 |
| 4,687,988 | 8/1987 | Eichelberger et al. | 324/73 AT |
| 4,812,962 | 3/1989 | Witt | 364/490 |
| 4,816,692 | 3/1989 | Rudert, Jr. | 250/492.22 OR |
| 4,878,177 | 10/1989 | Ikenaga et al. | 364/489 |
| 4,895,780 | 1/1990 | Nissan-Cohen et al. | 430/5 |
| 4,943,729 | 7/1990 | Ando et al. | 250/492.3 |
| 5,086,398 | 2/1992 | Moriizumi | 364/490 O R |
| 5,159,201 | 10/1992 | Frei | 364/490 X |
| 5,182,718 | 1/1993 | Hasafuji et al. | 364/490 OR |

FOREIGN PATENT DOCUMENTS

0496159A3  7/1992  European Pat. Off. .

OTHER PUBLICATIONS

IBM Technical Disclosure Bulletin, vol. 22, No. 11, Apr. 1980; "Data Zoning In The Proximity-Effect Correction Technique"; M. Parikh; pp. 5187-5189.

"Verification of a proximity effect correction program in electron-beam lithography"; E. Kratschmer; J. Vac. Sci. Technol., Nov./Dec. 1981; pp. 1264-1268.

IEEE 21st Design Automation Conference, Chapman et al, "The Scan Line Approach to Design Rules Checking: Computational Experiences", pp. 235-241. 1984, No Month.

IBM Technical Disclosure Bulletin, vol. 20, No. 9, Feb. 1978, Chang, et al., "Partitioning E-Beam Data for Proximity Corrections", pp. 3809-3812.

Japanese Journal of Applied Physics, vol. 30, No. 3B, Mar. 1991, Abe, et al., "Representative Figure Method for Proximity Effect Correction", pp. 528-531.

Primary Examiner—Emanuel T. Voeltz
Assistant Examiner—Kamini S. Shah
Attorney, Agent, or Firm—Whitham, Curtis, Whitham & McGinn; Charles W. Peterson, Jr.

[57] ABSTRACT

In electron beam lithography, an apparatus and method decompose rectangles at the exterior of a desired electron beam exposure pattern into portions having a substantially constant environment. This process also includes sorting of rectangles into bands in order of addresses of the rectangles and the assignment of labels or tags to the resulting rectangles indicating the edge(s) of the rectangle at which cuts were made to form the rectangle. When these rectangles are further decomposed by increment cutting and processes to receive exposure doses corrected by mutual proximity effects, including recombination of rectangles having the same assigned exposure dose, improved location of cut boundaries is achieved. Overexposure and resultant blooming of the pattern is prevented and exposure dose is assigned with higher accuracy since any averaging of exposure dose will be over a region having a substantially constant environment of neighboring shapes. Additionally, by ordering of the shapes, and cutting (with recombination) in plural steps, data carried forward in subsequent processing is reduced and accumulation of exposure correction information is facilitated.

20 Claims, 12 Drawing Sheets

(PRIOR TECHNIQUE)

(PRIOR TECHNIQUE)

(PRIOR TECHNIQUE)

FIG. 4
(PRIOR TECHNIQUE)
FIG. 5
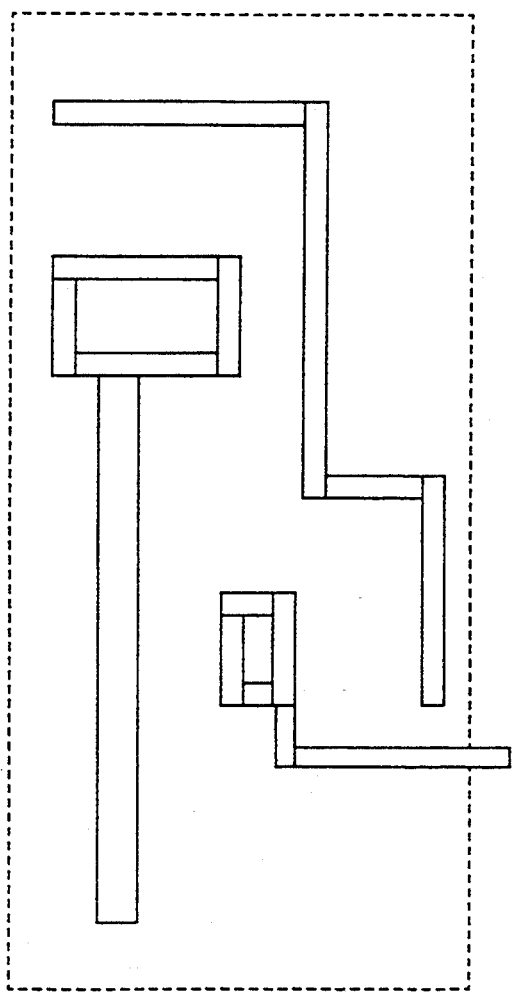
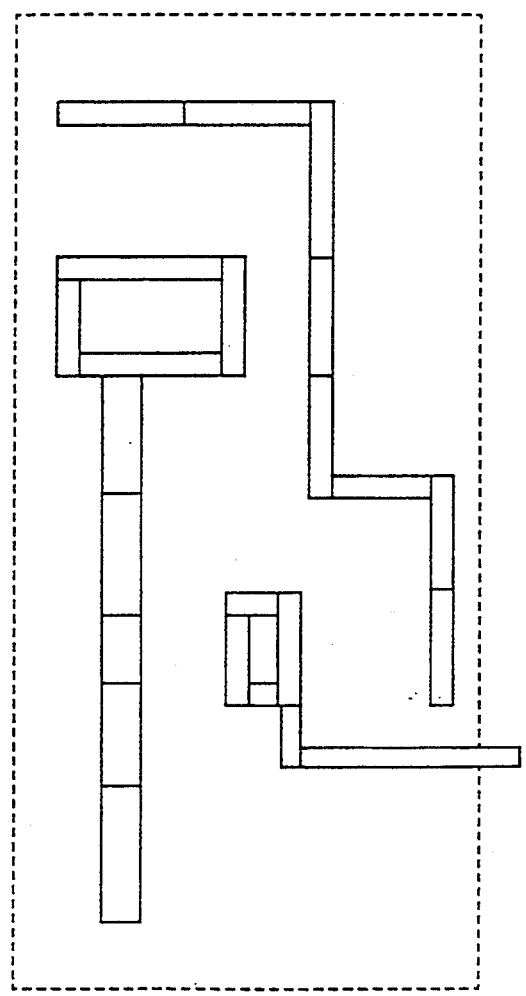

SYSTEM AND METHOD FOR PREPARING SHAPE DATA FOR PROXIMITY CORRECTION

This application is a continuation of application Ser. No. 08/010,715, filed Jan. 29, 1993 now abandoned.

BACKGROUND OF THE INVENTION

1. Field of the Invention

The present invention generally relates to electron beam (e-beam) lithography apparatus and, more particularly, to performance of proximity correction of exposure patterns produced thereby to compensate exposure of a portion of a desired pattern which is in the vicinity of another portion of the desired pattern.

2. Description of the Prior Art

In the past, many types of electronic devices have utilized structures including patterns of conductive material on a substrate to form connections between electronic devices such as resistors, capacitors and transistors either mounted or formed thereon. Printed circuit boards are an example of such structures. More recently, such structures have been used in integrated circuits, multi-layer ceramic (MLC) devices and similar devices in which complex circuits are formed at very high density. The density and size at which the connection patterns are formed is particularly critical in integrated circuits.

Such conductive patterns are typically formed, for efficiency and general reliability regardless of the density or size of features of the conductive pattern, by applying a pattern of resist to a layer of conductive material and then etching away areas of the conductive material where resist is not present. Particularly at small sizes, patterning of the resist is typically done by exposing a layer of a resist to a pattern of radiation such as light and then removing either the exposed or unexposed portions of the resist. As feature size has decreased, different types of radiation have been used to obtain higher exposure accuracy and resolution. Exposure with charged particle beams such as electron beams has become widely used for high density integrated circuits.

In electron beam (e-beam) exposure systems, often referred to as "e-beam tools" or simply "tools", the exposure is made by calculating the locations and sizes of portions of the desired exposure pattern. Several approaches have been made to decomposing the desired pattern into shapes which are generally rectangular. U.S. Pat. Nos. 4,878,177, to Ikenaga, and 4,482,810 to Cooke are exemplary of such arrangements. For the purpose of conveying an understanding of this invention, the decomposition of shapes will be considered as decomposition into rectangular pattern portions, tiling these portions with smaller rectangles (e.g. interior and exterior rectangles) and then tiling the smaller rectangles with rectangular exposure spots which are written sequentially at extremely high speed. These rectangular exposure spots or spot rectangles have a maximum dimension, called a maxspot size or simply maxspot in both coordinate directions (hereinafter referred to as horizontal and vertical for convenience) and, where edge location is critical, are usually limited in dimension in one of the coordinate directions to the dimension at which best focus of the tool is obtained. The other dimension of the exposure spot will usually be the full maxspot size unless a smaller spot is required. Such a smaller spot is referred to as a remainder spot. There is also a practical limitation on the minimum size of a remainder spot, referred to as a "sliver", and a constraint is placed on rectangle division that prevents division being made which would produce such a dimension. This constraint is necessary since it is possible to compute a valid exposure dose for a region which is smaller than the e-beam tool can accurately produce.

Incidentally, the technique of proximity correction referred to herein as the prior technique, method, process and the like are specifically not admitted to be prior art as to the present invention. In order to convey a better understanding of the nature and meritorious effects of the invention, the prior technique is so identified as a matter of convenience to permit a better understanding of the invention by allowing the invention to be contrasted therewith.

In the prior technique, the locations and sizes of each of the individually exposed spots are typically determined by a computer and the tool accordingly controlled thereby to develop the high speeds required in view of the extremely large numbers of spots to be written and the desired throughput of the tool. Data processing requirements are reduced substantially by dividing the desired exposure pattern into rectangular portions which may each contain one or more exposure spots. Tiling of such rectangles with exposure spots in a sequential order is a very orderly procedure which can be done autonomously under computer control once the bounds of each rectangular portion are established.

As with any radiation sensitive material, exposure time is cumulative. Although exposures may be readily determined and controlled in an ideal manner, an inherent problem in e-beam exposure tools is secondary emission and forward scattering (e.g. localized dispersion of the beam, measurable at the tool, as it travels to the target due to mutual repulsion of electrons in the beam, aberrations of electron lenses in the tool, variations in electron velocity and quantum effects) as well as some degree of backscattering of electrons from the resist target (or underlying structure) being exposed. At a nominal acceleration voltage of about 50 KV needed to provide an adequate e-beam current for rapid exposure of the ideal pattern, a significant further exposure occurs in the vicinity of each exposed spot due to the secondary emission and backscattering of electrons. This effect will occur over a generally circular area having a radius which will be referred to hereinafter as the scattering distance. In fact, however, the distribution of impinging electrons resulting from scattering and/or secondary emission may be statistically described and extend, to some degree, beyond this radius. The radius referred to hereinafter is the distance beyond which cumulative exposure effects can be neglected. It is also to be understood that both effects of backscattering and secondary emission are to be considered together and references hereinafter to secondary emission or proximity effects should be considered as including both secondary emission and electron scattering effects, such as forward scattering, as discussed above, which also contribute to the additional exposure.

Incidentally, the exposure profile along the radius of the area over which secondary emission effects occur is usually highly non-linear unless adjusted by e-beam acceleration voltage as in Ban et al, U.S. Pat. No. 4,500,789, and the exposure due to scattering effects only slightly changes the shape of the exposure distribution curve. The shape of this curve may be considered to a greater or lesser degree in the proximity correction algorithm utilized to determine the actual exposure values. However, the actual proximity correction algorithm employed is not important to the practice of the present invention.

When it is considered that exposure levels must usually saturate the sensitized material to obtain full contrast, it can be understood that overexposure by secondary emission and scattering can easily cause "blooming" of the pattern. While blooming may not seem to be important at the interiors of relatively large shapes, it causes loss of geometrical definition and resolution of the pattern at edges thereof and is therefore particularly objectionable when fine pattern detail is to be produced. Therefore, there is often a need to compensate exposure spots at both the interior and the edges of patterns; the latter often being referred to as exterior rectangles, determined by a process called sleeving, for the secondary emission exposure from exposure of interior spots.

An exemplary sleeving technique is shown in U.S. Pat. No. 4,943,729, to Ando et al. IBM Technical Disclosure Bulletin, Volume 20, No. 9, pp. 3809–3812, *Partitioning E-Beam Data For Proximity Corrections,* by Chang et al. also teaches a technique similar to sleeving for partitioning pattern data by forming a large perimeter around a shape and modifying exposure dose where the enlarged perimeters meet for partial proximity correction.

U.S. Pat. Nos. 4,426,584 and 4,504,558 to Bohlen et al. teach proximity corrections in a projection e-beam lithography arrangement by using multiple masks to alter exposure dose. Other approaches to proximity correction are taught by U.S. Pat. Nos. 4,895,760, to Nissan-Cohen, which applies windage to a pattern in accordance with multiple exposures, and 4,812,962, to Witt, which involves stepping across a pattern to identify neighboring areas of a given shape, 4,816,692, to Rudert, Jr., which is directed to a pattern splicing system, and 4,099,062, to Kitcher, which is directed to multiple overlapping exposures at reduced exposure levels.

While these techniques have yielded substantial improvement in pattern accuracy, such techniques often require time-consuming multiple exposures and have not accounted for the fact that, at the present state of the art, the optimum focus dimension and, hence, the potential feature size of the pattern has been reduced below the distance over which secondary emission and scattering causes cumulative exposure. Therefore, mere sleeving compensation is inadequate to fully exploit the currently available resolution of e-beam tools. Further, at such a scale, several factors cause any attempt at a further level of compensation to become computationally formidable. This can be readily understood from the observation that, potentially, each spot exposure affects and is affected by every other spot exposure within a radius which corresponds to the secondary emission scattering exposure distance. Further, as exposures are progressively made over the writing area, the exposure of a spot may cause alteration of exposure of a second spot within the scattering exposure distance and, thus, in turn, affects the exposure of a spot beyond the scattering exposure distance. The same is true for each spot rectangle in every rectangular shape in the desired pattern. In either case, the computational overhead increases enormously as the number of related exposure areas (either spots or rectangles) is increased, as is the case when spot size is reduced.

Exemplary known computational techniques are taught by Eichelberger et al., U.S. Pat. No. 4,687,988, IBM Technical Disclosure Bulletin Vol. 22 No. 11, pp. 5187–5189, *Data Zoning in the Proximity-Effect Correction Technique,* by M. Parikh, and *Representative Figure Method for Proximity Effect Correction,* by Abe et al., Japanese Journal of Applied Physics, Vol. 30, No. 3B, March, 1991, pp. L528–L531. All of these computational techniques require either such a large quantity of data that computation cannot be efficiently done or involve simplifying assumptions which reduce the accuracy of the computational result below an acceptable level.

It is to be understood that the ability to make compensating exposure corrections is therefore limited by the ability to organize and process such potentially massive amounts of data. It is for this reason that the resolution of known processes has remained poor. That is, the amount of data which can be processed in a practical fashion is limited. Therefore, the number of rectangles on which correction can be made is relatively low and the average size of correctable rectangles remains large, resulting in poor resolution of the exposure compensation process. This limitation of prior exposure compensation processes exists regardless of the proximity correction algorithm employed.

SUMMARY OF THE INVENTION

It is therefore an object of the present invention to provide a method and apparatus for improving the resolution at which proximity correction for secondary emission exposure can be carried out.

It is a another object of the invention to provide a technique for cutting rectangles and sorting and organizing data concerning rectangles to allow reduction of processing time by a proximity correction algorithm while increasing resolution of the correction process.

It is a further object of the invention to provide a data structure which allows improved performance of a proximity correction algorithm.

It is yet another object of the invention to provide a technique of optimizing the cutting locations of rectangles forming portions of a desired pattern in order to avoid pattern distortion with a minimum number of rectangles.

It is another further object of the invention to provide a technique for decomposing rectangles in which the amount of data carried forward in the process is kept as small as possible and in a format which facilitates subsequent processing.

In order to accomplish these and other objects of the invention, a method is provided for partitioning shapes included in an exposure pattern including the steps of dividing the exposure pattern into shapes including interior and exterior rectangles, the exterior rectangles having a predetermined maximum width and arbitrary length, subdividing at least one of the exterior rectangles at a location along its length having the same horizontal or vertical address as the boundary of a shape in the exposure pattern which is within a scattering distance of the at least one of the exterior rectangles, and storing a description of each rectangle resulting from the subdividing step, the description including at least an address corresponding to the location, the descriptions forming an ordered list in accordance with at least one the address.

BRIEF DESCRIPTION OF THE DRAWINGS

The foregoing and other objects, aspects and advantages will be better understood from the following detailed description of a preferred embodiment of the invention with reference to the drawings, in which:

FIG. 4 is an exposure plot of another pattern portion as performed by prior techniques, FIG. 5 is an exposure plot of the pattern portion shown in FIG. 4 as performed by intelligent partitioning in accordance with the invention.

DETAILED DESCRIPTION OF A PREFERRED EMBODIMENT OF THE INVENTION

Figure 1A:
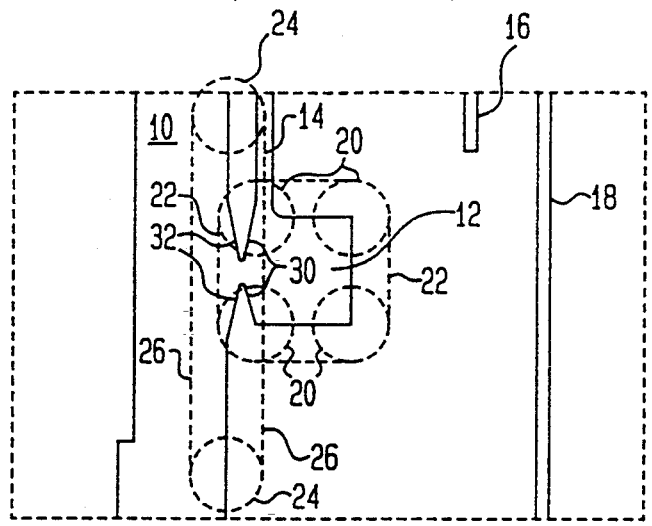
FIGS. 1a and 1b are drawings of a portion of a connection pattern as formed by a method including proximity correction as performed by prior techniques.
Figure 1B:
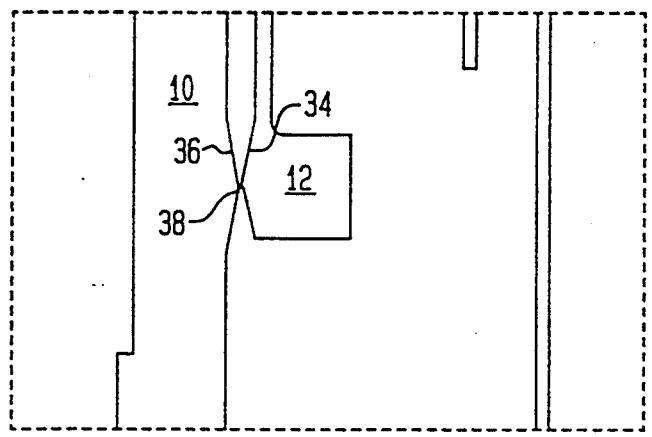
Figure 1C:
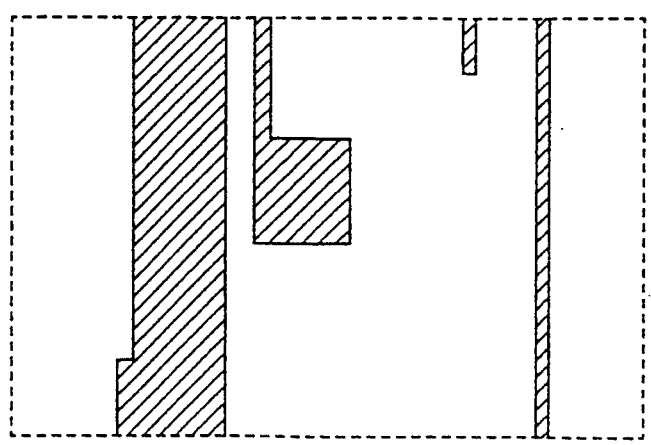
FIG. 1c is as ideal pattern which results in actual patterns such as those of FIGS. 1a and 1b using prior techniques.

Referring now to the drawings, and more particularly to FIGS. 1a–1c for an appreciation of the problem addressed by the invention, a portion of a connection pattern as it would be formed in a device is shown in FIGS. 1a and 1b. A corresponding ideal pattern is shown in FIG. 1c with diagonal hatching showing areas of, for example, metallization. While these Figures are somewhat idealized, the patterns illustrated in FIGS. 1a and 1b are similar in all pertinent detail to a pattern in an actual device resulting from efforts to produce the pattern of FIG. 1c and which has caused a marked reduction in manufacturing yield of that device.

FIGS. 1a and 1b correspond to precisely the same rectangle articulation and exposure data in accordance with FIG. 1c. The slight difference between them has resulted from variations in processing within the normal range of acceptable manufacturing tolerances. In the case of FIG. 1a, a short has been caused between wide conductor 10 (a power supply bus) and pad 12 due to the proximity therebetween. Dashed circles 20 have been drawn at the nominal pattern corners of pad 12 to provide an indication of the approximate diameter of major secondary emission exposure which would occur at those points. Since spot exposures are made throughout the area of pad 12, secondary emission exposure will occur at any point of a pattern portion which is overlapped by the boundary indicated by dashed circles 20 as joined by dashed lines 22 causing proximity effects to occur. It should also be noted that cumulative exposure will differ at the corners of a pad or other shape due to the alteration of the environment of the corners in comparison with the central regions of edges due to the different distribution of interior rectangles. Similarly dashed circles 24 connected by dashed lines 26 are shown for the secondary emission exposure region corresponding to an edge of conductor 10. Conductors 16 and 18 are located sufficiently far away from this region and from each other that proximity effects do not occur.

Connection 14 is formed of rectangles which are preferably of only a single spot width corresponding to the best focus of the e-beam tool. However, pad 12 must be tiled with a matrix of exposures due to its width, and blooming will occur as a function of distance from the top and bottom edges of pad 12, as illustrated. Blooming will also occur at the edge of conductor 10 inside boundary 24. The blooming at 32 will be less than at 30 because of reduced proximity of connection 10 to exposure spots on the interior of pad 12 from which the secondary emission exposure will reach the edge of pad 12 but not the edge of connection 10. It should also be noted that connection 14 does not cause significant blooming since it is produced by a rectangle which is different from the rectangle used to produce pad 12 and can be separately proximity corrected. However, it is to be noted, in this regard, that the illustrated portion of connection 14 is only within the scattering radius of wide power bus 10 and thus the environment of connection 14 is substantially constant over the illustrated portion thereof. The proximity effects on connection 14 due to additional exposure from pad 14 are illustrated at the radius formed by blooming at the junction of connection 14 and pad 12.

In FIG. 1b, the effect of blooming is not as severe and no short is formed. However, it can be seen that blooming nevertheless occurs in areas having the same geometric relationship as in FIG. 1a. The blooming 34 at the edge of pad 12 is markedly greater than blooming from the edge of connector 10 due to additional secondary exposure from the interior of pad 12. The proximity of the two conductive regions 10 and 12 at 38 is sufficient to cause a reduction in breakdown voltage which the device can withstand. Also, due to some metallurgical effects, a short could later form under operational conditions.

Figure 2:
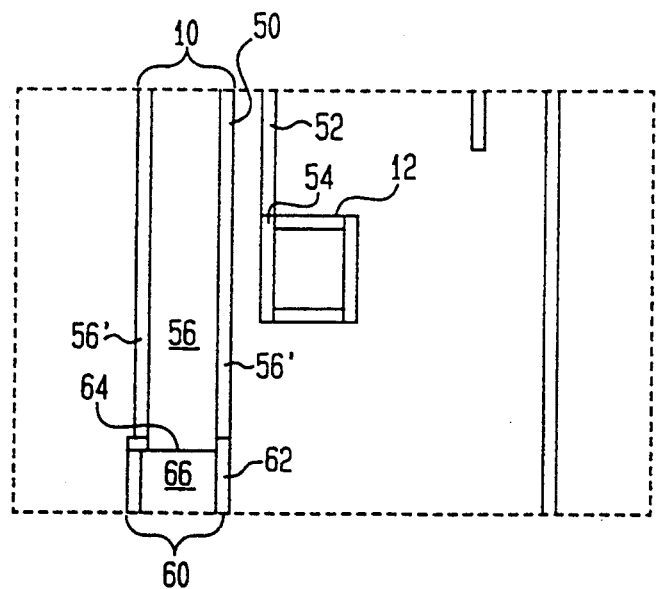
FIG. 2 is an exposure plot in accordance with the pattern of FIGS. 1a and 1b as performed in prior techniques.
Figure 3:
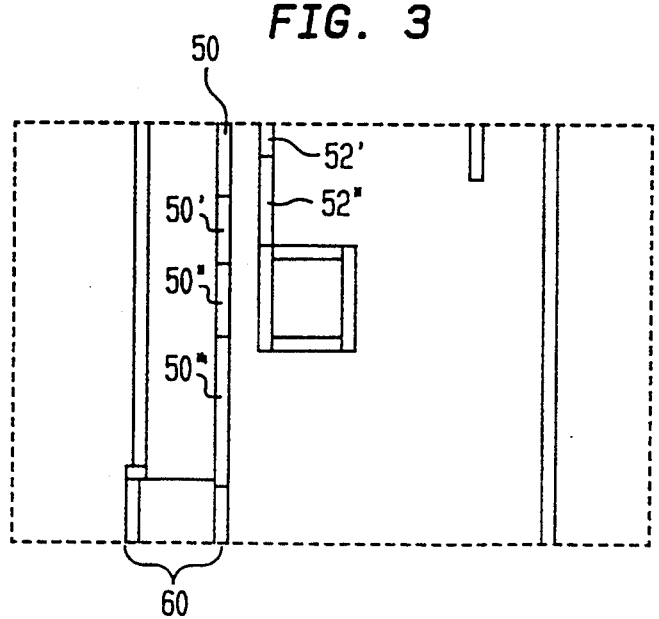
FIG. 3 is an exposure plot in accordance with the pattern of FIGS. 1a and 1b as performed by the invention.

As seen in FIG. 2, which shows articulation of the pattern into exposure rectangles, no differentiation of exposure is made by division of exterior rectangle 50 formed by sleeving of conductor 10. Therefore, blooming will occur as indicated in FIGS. 1a and 1b. In contrast, as shown in FIG. 3, the invention subdivides rectangle 50 into several smaller rectangles 50, 50', 50", 50''', which may be individually proximity corrected. Rectangle 52 is also divided into rectangles 52' and 52" due to proximity to the upper edge of pad 12, as illustrated.

Incidentally, it should be noted that the necessary proximity correction to obtain acceptable results depends to a large degree on the width of a pattern portion in a direction orthogonal to an edge since the number of spots tiled into the interior of the pattern portion within a scattering distance from an edge determines the amount of cumulative secondary emission exposure that will occur. This is the direct cause of the differential blooming at 34 of FIG. 1b toward conductor 10 as compared with blooming at 36 toward pad 12. In other words, the formation of a connection pad which must be tiled with spot rectangles will cause multiple secondary emission exposures whereas a narrow conductor formed with a single spot rectangle across its width will cause only a single secondary emission exposure. Wide conductor 10 also receives exposure correction as indicated at 56 and 56' of FIG. 2. The prior technique differentiates rectangles 52 and 54 even though these rectangles are portions of the same conductor since rectangle 54 is a sleeve rectangle and rectangle 52 is not. The location of the division is already available as part of the data defining the location of pad 12 and thus does not increase the amount of data to be processed or require any processing in order to determine the location of such a division. Moreover, the formation of such a pad is relatively rare in comparison with the number of occurrences of locations where a conductor will pass within a given distance of a pad when that given distance, corresponding to the scattering distance, is several times the feature size of the pattern portion being exposed.

Such a circumstance is shown in another pattern portion illustrated in FIGS. 4 and 5. In this pattern, the number of rectangles is increased in FIG. 5 in accordance with the invention from that of FIG. 4 to more fully compensate for proximity effects and to avoid blooming. Specifically, since the prior technique could not provide full proximity correction, long conductors were merely averaged over their length as to the exposure correction necessary at any point in order to bring the quantity of data within a manageable volume. Therefore, no divisions of long rectangles is to be seen in the results of the prior proximity correction technique of FIG. 4. This averaging, therefore, does not prevent blooming or even the possibility of open circuits due to underexposure when overcorrection of the average is caused by one or more wide pads in the vicinity of portions of a narrow conductor. Although blooming is likely to be less severe in this particular pattern portion because no wide conductors (but only pads) are present, as in FIGS. 1-3, the potential for blooming and the inability of the prior technique to adequately compensate for proximity effects imposes a minimum spacing between conductors which is much larger than the minimum feature size which can be exposed, thus limiting integration and/or pattern feature density of the device.

Referring again to FIGS. 2 and 3, note also that in this particular pattern, the width of conductor 10 changes as indicated at 60. In FIG. 2, the boundary of exterior rectangle 62 corresponds to the boundary 64 of interior rectangle 66, indicating that no particular processing was done to locate such a division point. However, such a division point is not optimal due to proximity to the relatively narrower portion of conductor 10 formed by interior rectangle 56 and exterior rectangles 56'. It is significant to note that at similar changes of width of conductors, which occurs quite frequently in design of conductive patterns of this type, the rectangle boundary can be optimally located without increasing the number of data which must be used during exposure in this and similar instances.

Figure 19:
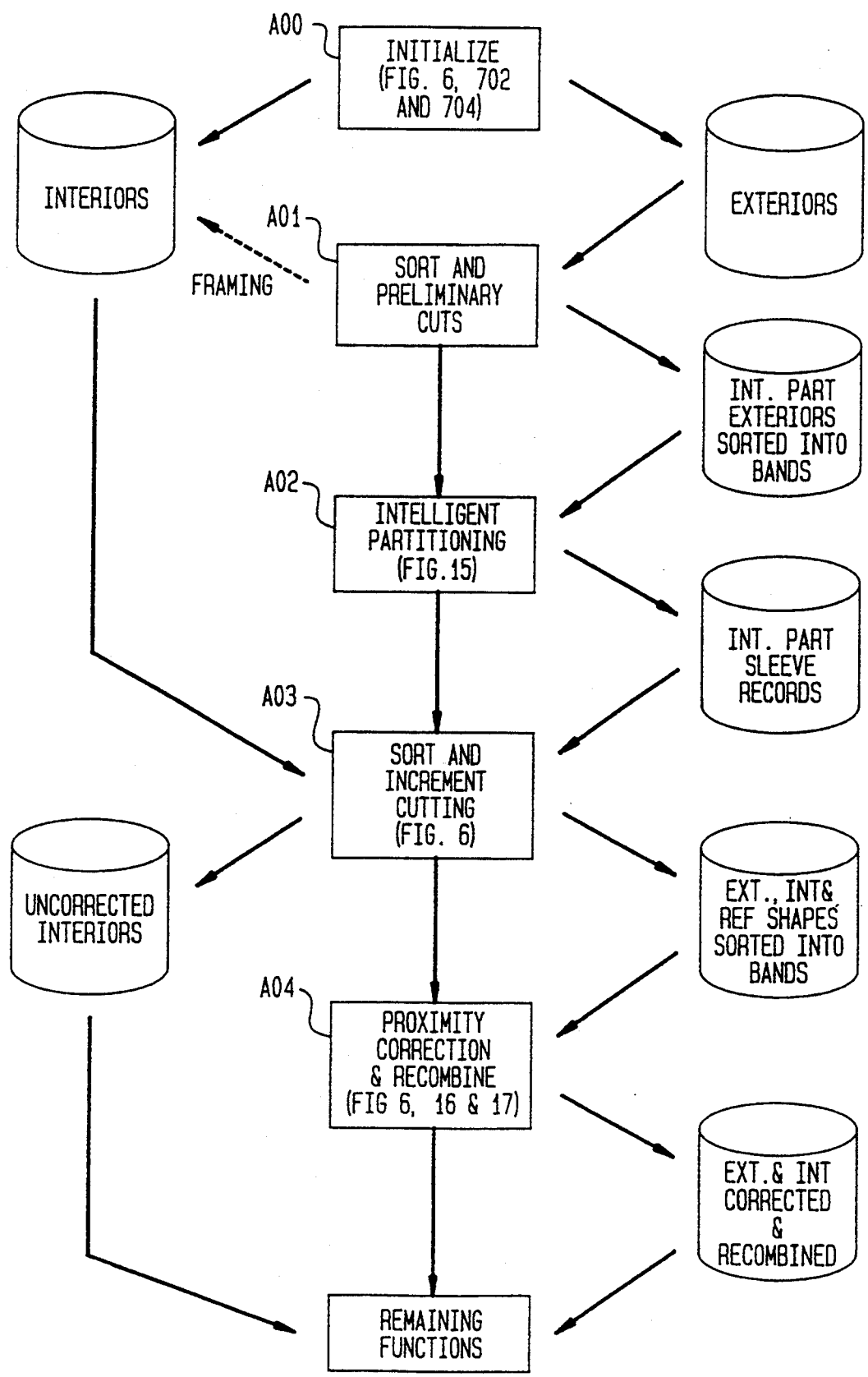
FIG. 19 illustrates the overall process sequence and data storage in accordance with the invention.

In order to more adequately compensate for proximity effects without increasing computational complexity beyond the point where throughput of the system is diminished to an unacceptable degree, the invention provides a technique and arrangement to perform cutting, sorting and organizing of rectangles to greatly increase the accuracy and reduce the processing costs and nearly minimize data during compensation of proximity effects. Referring briefly to FIG. 19 for an overview of the entire proximity correction process including the invention, cutting of rectangles is done at several stages based on different criteria. Again, it is to be understood that the invention is directed to a methodology of cutting, sorting and organizing rectangles and other shapes to provide an environment for a proximity correction algorithm wherein the performance of that algorithm is improved both computationally and in the pattern resulting from the e-beam exposure, regardless of the proximity correction algorithm employed.

Initialization of the process A00 sets initial conditions of buffers and pointers and establishes locations of rectangles which form the pattern by addresses (which, by a preferred convention, is the location of the first corner (e.g. upper left corner) of the rectangle which is encountered in a scanning pattern over the surface) and dimensions. It is assumed that sleeving, itself well known in the art, has been done and the resulting rectangles may be sorted according to whether a particular rectangle is an interior or exterior rectangle for separate storage. Generally speaking, proximity correction of interior rectangles is far less critical than for exterior rectangles since their environment (e.g. surrounding exposure areas) becomes increasingly uniform toward the center of large shapes. Therefore, it is the exterior shapes which require substantially increased processing.

The exterior rectangles are first sorted and preliminary cuts are made into bands to limit the extent of searching for neighbors. The width of the bands is preferably chosen so that the scattering range will only extend over a relatively small number of neighboring bands. Further, at this stage, framing, which will be discussed in greater detail below, may be done and will cause further rectangles generated in the process to be stored with interior rectangles.

Figure 15:
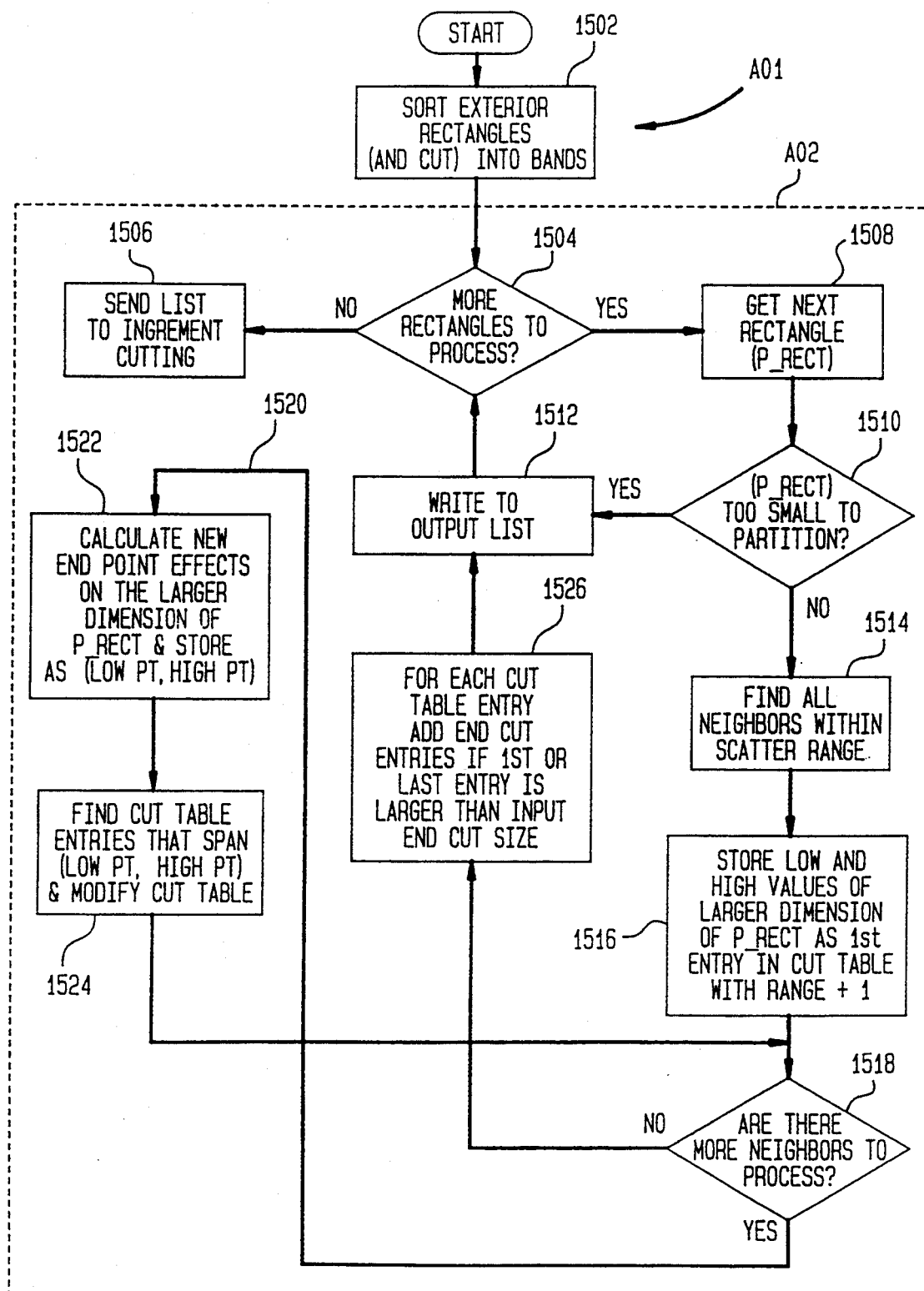
FIG. 15 is a flow chart of the intelligent partitioning portion of subroutine 706 of FIG. 6.

Additional cutting (A02) of the exterior rectangles is done in accordance with the flow chart of FIG. 15 based on the environment of each exterior rectangle; the environment of each exterior rectangle being determined by the proximity and boundary locations of neighboring shapes. This environment-based cutting of rectangles in accordance with the invention is referred to as intelligent partitioning and also provides for the recombination of some rectangles which were previously cut in order to minimize the number of rectangles which must be processed in other stages of the exposure computation process.

Subsequent to cutting of rectangles based on environment, further, incremental cutting (A03) and further sorting is done to make shapes small enough that there cannot be major difference in exposure dosages between adjacent cut shapes and to limit the extent of the search required for neighboring shapes. For example, a small rectangle will not extend far enough in any direction to encounter significant variation in its environment. By the same token while a large shape would require a search for neighbors over its entire extent in both coordinate directions plus twice the scattering distance, a small rectangle within the larger shape, while requiring a search meeting the same criteria requires only a search over a distance greater than twice the scattering distance by its own length, thus greatly reducing the bounds of the required search and thus also greatly reducing the number of neighboring shapes for which corrections must be computed. While the number of such smaller rectangles is increased, the number of corrections for each results in a substantial net improvement in reduction of computational complexity.

Proximity correction may then be rapidly done on the incrementally cut rectangles to determine final exposure dose for each. Recombination is then performed on the basis of calculated exposure dosages. Since recombination as well as cutting is done at several stages of the process, the processing is always limited to cuts which are likely to contribute to the optimization of the final cut positions and thus the quantity of data to be processed is reduced and the speed of the processing correspondingly increased.

Subsequent to the initial cutting of the shapes into rectangles as in the prior technique and the division of the rectangles so obtained into exterior and interior groups, but prior to increment cutting, which is, itself, well-understood in the art, the exterior rectangles are cut (A02), in accordance with the invention, in a manner to capture information concerning the environment of each portion of each exterior rectangle, as will be discussed in greater detail below with reference to FIGS. 8–13 and the flow chart of FIG. 15. This step, in accordance with the invention, is referred to as intelligent partitioning and is done is a manner to ensure that the environment (e.g. the proximity to other portions of the desired pattern) is substantially constant over the extent of each of the intelligently partitioned rectangles. The substantially constant environment of each of the rectangles ensures that any known proximity correction algorithm will perform substantially optimally to calculate a dose for each rectangle since any averaging done by the proximity correction algorithm will provide a more accurate exposure dose value if the averaging is done over a substantially constant environment.

Intelligent partitioning (A02), in accordance with the invention, also provides a tag or label, preferably stored in the form of one byte contained in each record describing a rectangle (e.g. by upper left corner location and size) until recombination is complete, for each rectangle concerning the type of cut which was made in order to reduce data volume and simplify searching during further processing. Subsequent increment cutting, where the cutting dimension is based on scattering characteristics and the precision of edge location required, thus initially contains and takes account of the environment since the process is performed on rectangles which have already been cut in accordance with that criterion. Increment cutting is performed on both interior and exterior rectangles to tile the rectangles with rectangular spots and is, per se, known in the art. However, the performance of the increment cutting process (A03) is substantially improved by storing of rectangles in accordance with bands and labels, generated during intelligent partitioning (A02) to facilitate neighbor search and recombination. Therefore, the combination of intelligent partitioning with increment cutting is considered to be within the scope of the present invention.

After increment cutting of rectangles, all rectangles are processed through a proximity correction algorithm in the order established by the previous cutting of the intelligent partitioning which allows minimized searching for neighbors and accumulation of mutual proximity effects in order (e.g. considering only rectangles having either higher or lower addresses, depending on the direction of processing).

As a final portion of the process according to the invention, the resulting rectangles are reprocessed to recombine all adjacent rectangles which require the same exposure dose by following the labels indicating the types of cuts which were previously made which link the cut rectangles in chains. Whatever proximity correction algorithm is used is nested between the processes of increment cutting and this second stage of recombination. This recombination of rectangles is based on the dose of each rectangle as computed by the particular proximity correction algorithm used and reduces the final data volume as much as possible consistent with the avoidance of blooming and loss of positional accuracy of edges. In the combination of intelligent partitioning together with increment cutting, recombination ultimately provides new rectangle boundaries at optimal locations which will assure optimal performance of whatever proximity correction algorithm is used. The organization of the data provided by the intelligent partitioning process and increment cutting stage also enhances the speed at which the processing will be carried out since the minimum necessary volume of data will be carried forward from any stage of the process to subsequent stages of the process.

More specifically, the process of intelligent partitioning makes cuts of rectangles at locations which approximate the locations where the rectangle enters a region within a scatter range (e.g. the secondary emission and/or scattering radius) of a portion (e.g. a corner) of another rectangle. The intelligent partitioning stage may thus be rapidly done based upon the locations of edges of neighboring shapes while the final location of boundaries is based upon the cuts made during increment cutting and based on the computed exposure dose. Thus the final rectangle boundaries are automatically optimized for the proximity correction algorithm and the data for controlling exposure automatically minimized, regardless of the particular proximity correction algorithm adopted. Placement of these locations is sufficient since the additional boundary locations are reached by increment cutting within the rectangles cut by intelligent partitioning and the second stage of rectangle recombination, alluded to above. This process can be done in regard to interior rectangles, exterior rectangles or both and framing rectangles, as well. However, it will be sufficient for an understanding of the invention to describe the process in terms of only exterior rectangles. As a practical matter, the cost-effectiveness of the present invention, at the present state of the art, is significantly greater when performed on exterior rectangles alone and therefore the process as applied to exterior rectangles constitutes the presently preferred embodiment of the invention. In any event, the principles of the intelligent partitioning process remain the same regardless of the portion of the pattern which particular shapes constitute.

Figure 6:
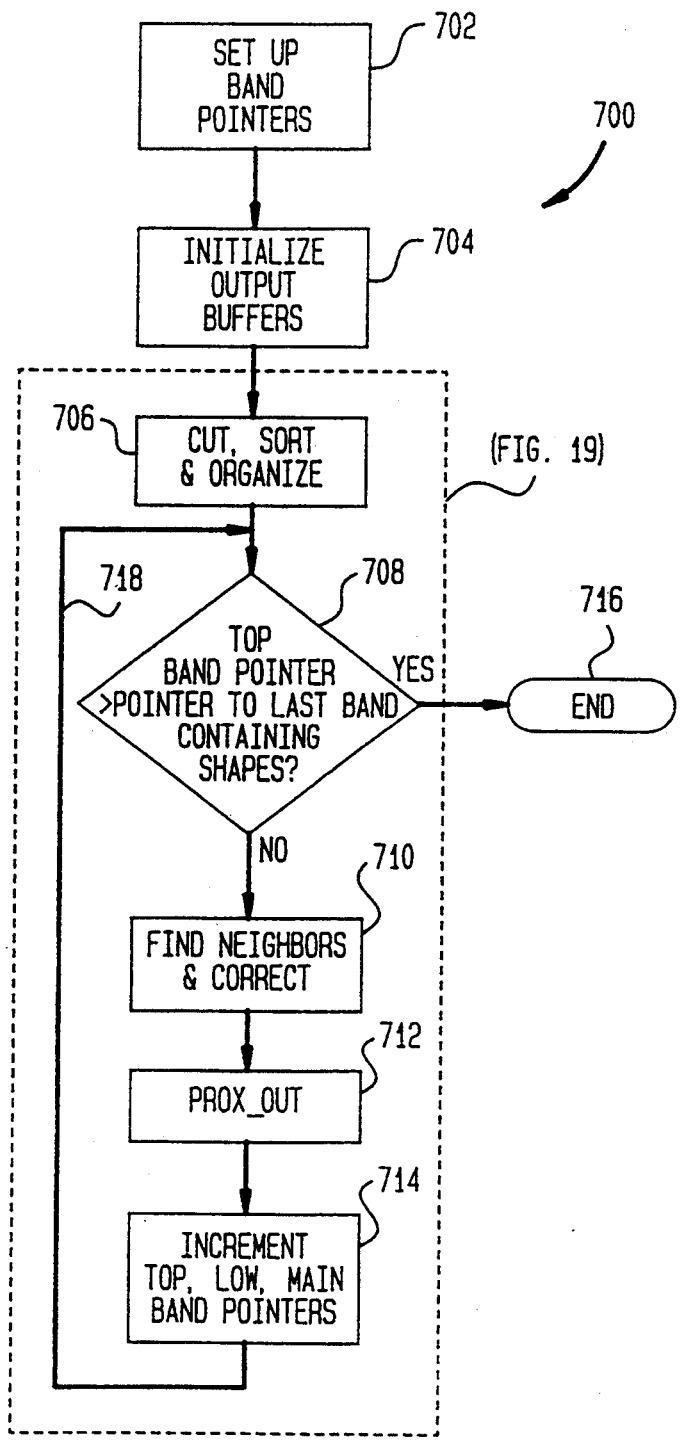
FIG. 6 is a flow chart of the overall system of the invention.

The overall system operation of the invention is shown in FIG. 6. In contrast with FIG. 19 and to assist in understanding of the invention, the cutting and sorting operations A02 and A03 of FIG. 19 are lumped together in cut, sort and organize operation 706, respective portions of which will be explained in greater detail below. Steps 702 and 704 are simply initialization steps (lumped together in FIG. 19) to set up initial conditions for the remainder of the process.

Figure 7A:
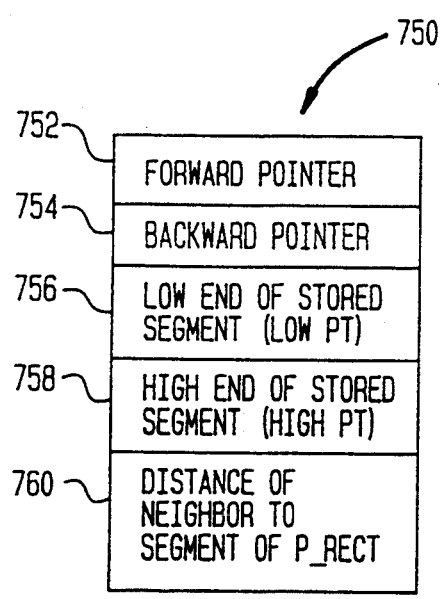
FIG. 7a illustrates an exemplary data structure of a cut table entry, showing how intelligent partitioning data is stored internally to the process, for performing subroutine 706 of FIG. 6.
Figure 14:
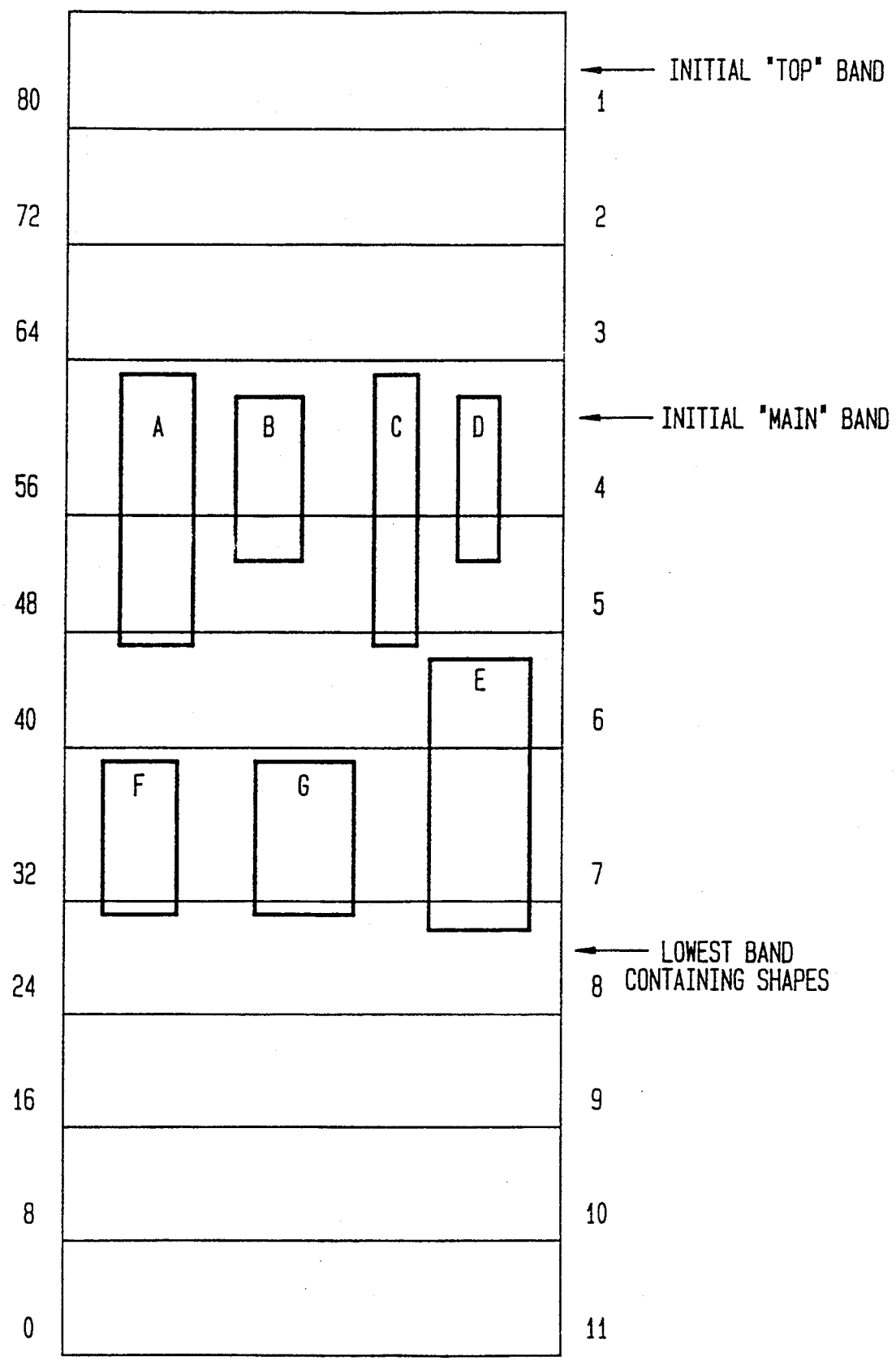
FIG. 14 is a diagram for explaining the relationship of rectangles and bands, in accordance with step 706 of FIG. 6.

The data structure used in the cut, sort and organize step 706 is shown in FIG. 7a. The band pointers, set up at 702 of FIG. 6, establish a sequence and width of bands as shown in FIG. 14. The width of each band is preferably an integral power of two multiple of the minimum increment of the tool to be controlled. Each rectangle to be processed is preferably addressable by the coordinates of at least one of its corners, as will be discussed in greater detail below. Setting the band width as an integral power of two multiple of the possible rectangle addresses allows all rectangles belonging to a band to be addressed by specifying the most significant bits of the addresses in the band and allowing all rectangles belonging to the band to be addressed as a group.

The initialization of output buffers 704 sets initial conditions for the system. This process also includes establishing initial conditions for the cut table list, shown in FIG. 9, and entries therein as will be discussed in greater detail in regard to FIGS. 9–13. The intelligent partitioning process is a major portion of the cut, sort and organize subroutine, illustrated at 706. The overall function of intelligent partitioning provides a series of cuts of rectangles which partition the rectangles into regions of substantially constant pattern environment based on distances in the respective coordinate directions from neighboring shapes. In the course of this intelligent partitioning, the rectangles are processed in a particular order and the resulting rectangles are written to output lists which are then inputted to the increment cutting stage. As a portion of this process, the resulting rectangles are organized into bands.

Beginning with a branching operation 708 to detect the completion of the overall operation and allow exiting thereof at 716, the process can merely loop 718 through successive bands, sequentially processing rectangles therein by detecting neighbors and applying a proximity correction ("Find Neighbors and Correct" 710) and locating chains of previously cut rectangles and recombining them where possible (PROX_OUT 712). Incrementing of pointers for the repeated loop 718 is performed at 714.

A detailed flow chart for the intelligent partitioning process is illustrated in FIG. 15. Corresponding pseudocode will be set out below. However, to convey an understanding of the intelligent partitioning process, reference is first made to the data structure 750 comprising an entry in a cut table, as shown in FIG. 7a. Such an entry is generated whenever a cut is made and describes the rectangle dimensions in a direction orthogonal to the cut. Since the cutting process proceeds in a given direction through a rectangle, two pointers are provided to indicate previous (754) and subsequent (752) cut rectangles in a chain which, in the aggregate, form the original rectangle. Specifically, assuming initial conditions where data for a given rectangle is stored at a particular address in a cut table, when a cut is made to form two smaller rectangles, the forward pointer corresponding to the original rectangle is changed to the location where the data for the newly created rectangle is stored. The backward pointer of the newly created rectangle is set to the address corresponding to the original given rectangle. The forward pointer of the newly created rectangle is set to the original forward pointer of the original given rectangle.

Locations of the two ends of the rectangle (P_RECT) corresponding to a given cut table entry are stored in portions 756 and 758 of the entry and the distance in the direction of the cut from a neighboring shape which causes the cut to be made is stored in portion 760. Since all rectangles operated upon by the intelligent partitioning of the present invention will have previously been cut into shapes which are only a single spot rectangle in either width or height by the cutting and sorting to form exterior rectangles, cuts will be made only in a single coordinate direction. Therefore the five data portions (e.g. two pointers, two end locations and a distance to a neighbor) are adequate to fully describe a cut rectangle and its environment. These portions 752–760 can be implemented in any desired form of addressable data storage.

Figure 8:
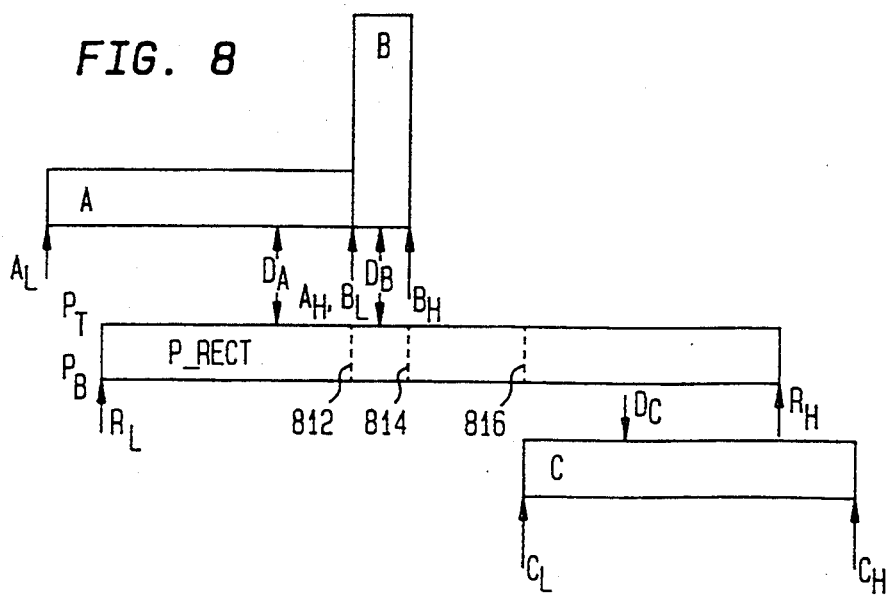
FIG. 8 shows an exemplary pattern portion for proximity correction in accordance with the invention.
Figure 9:
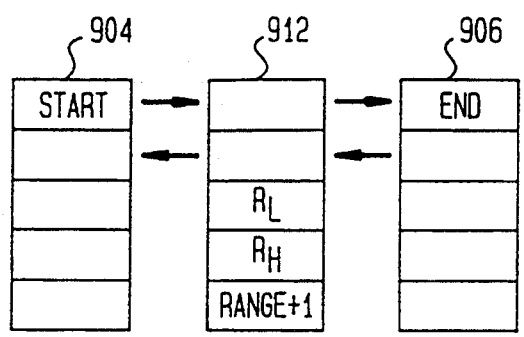
FIGS. 9, 10, 11, 12 and 13 illustrate an exemplary sequence of operations on cut table entries in accordance with FIG. 7 during performance of subroutine 706 of FIG. 6.
Figure 10:
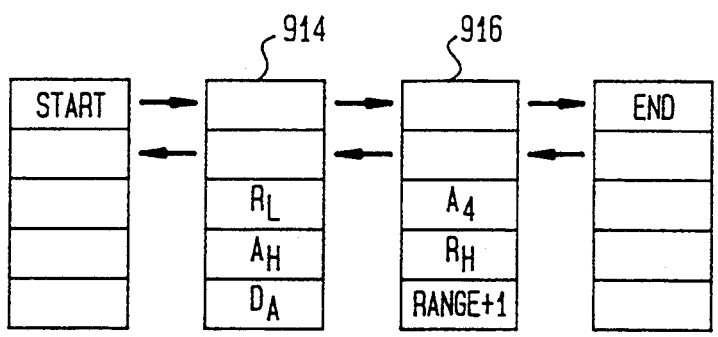

FIG. 8 shows an exemplary pattern of rectangular shapes, P_RECT, A, B and C. FIG. 9 shows the initial conditions of a cut table entry 912 corresponding to the uncut rectangle P_RECT. Dummy cut table entries 904 and 906 are preferably provided to hold pointers to entry 912. The initial conditions for the P_RECT entry 912 are the locations of the left and right ends of the rectangle, $R_H$ and $R_L$, and a default distance value preferably corresponding to the scattering range plus one. This default value facilitates the processing of comparisons and makes the process consistent throughout the intelligent partitioning process. This default value essentially defines what nearby shapes will be determined to be "neighbors" for purposes of the intelligent partitioning process. If the distance is greater than this default value, no cut need be made since the nearby shape will be beyond the secondary emission radius or will receive an approximately uniform level of scattering electrons.

The direction along either coordinate direction in which the cutting process is carried out is arbitrary, but, for greatest simplicity and data volume reduction, should be consistent throughout the process. In the following discussion, it will be assumed that on horizontal rectangles the process is carried out from left to right and on vertical rectangles the process is assumed to be carried out from bottom to top to correspond with conventions of other processes in accordance with a preferred embodiment of the invention. However, it is to be understood that this order is otherwise also arbitrary.

The cutting process begins at location $R_L$ specified in cut table entry 912 of FIG. 9. The adjacent rectangle A is found by scanning vertically from $P_T$ or $P_B$ at location $R_L$. A comparison of $D_A$, found by the scanning process, is compared to the default distance value and since, in this case, $D_A$ is smaller, the end point of rectangle A, $A_H$, is substituted for the initial values of the end point of P_RECT, $R_H$, and $D_A$ is substituted for the default distance as shown at table entry 914 of FIG. 10. Preferably, a cut is simultaneously made at $A_H$ and a new cut table entry 916 is generated. The lower and upper ends of the new rectangle are set to the cut location, $A_H$, and $R_H$, respectively, and the default distance is maintained therein.

Incidentally, although trivial in this particular case, a procedure is carried out to determine the proper location of a cut table entry within the chain (e.g. to properly form the links of a linked list) for the new rectangles and whether intelligent partitioning recombinations can be made. This is done simply by proceeding through the cut table entries according to the existing pointers and comparing end points of the new cut table entry with the previous cut table entries. When the correct location is found, the pointers are moved between cut table entries to effectively insert the new cut table entry in the correct sequence in the chain. When the new cut table entry is properly located, pointers are followed to the immediately preceding and following cut table entries and the distance portions 760 compared. If the distance portions are within a predetermined distance range and equal, the adjacent cut table entries are recombined.

Figure 11:
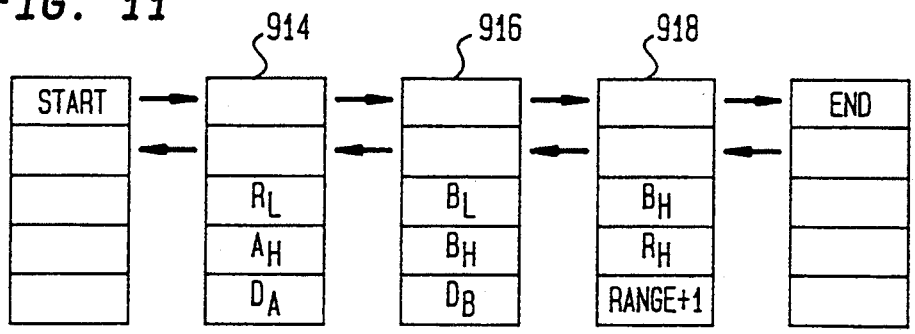
Figure 12:
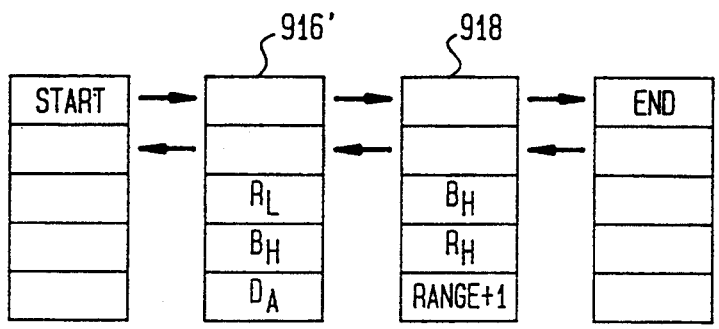
Figure 13:
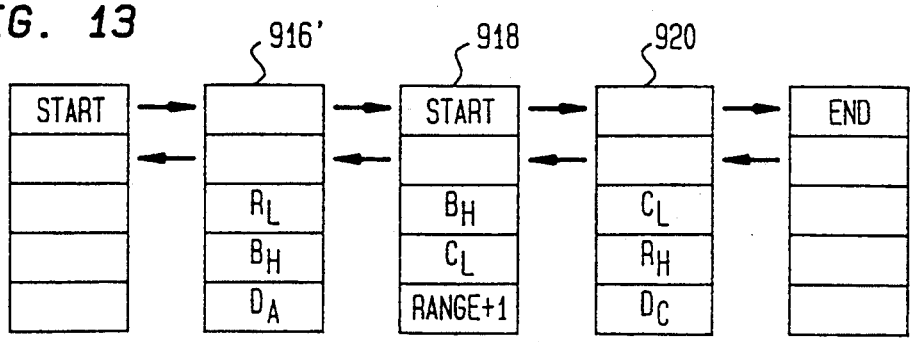

The process now continues from the lower end of the new cut rectangle described at 916 which is reached using the new value of the forward pointer or entry in 914. By scanning, rectangle B is located, a cut is made at 814 and a new cut table entry 918 is generated and located in the cut table in the same manner as with rectangle A, as shown in FIG. 11. When the values stored in the distance portions 760 are compared, $D_A$ and $D_B$ are found to be equal and recombination of cut table entries 914 and 916 is carried out to form cut table entry 916' as shown in FIG. 12. The process is then repeated by scanning vertically from $B_H$ as specified by cut table entry 918. When no rectangle is found, $B_H$ is incremented and scanning repeated until rectangle C is located beginning at $C_L$. Cuts are made and the new cut table entry is located and combined with another entry, if possible. Since, in this case, combination is not possible and $C_H$ is greater than $R_H$, the resulting final cut table state is shown in FIG. 13, including cut table entry 920.

Figure 20:
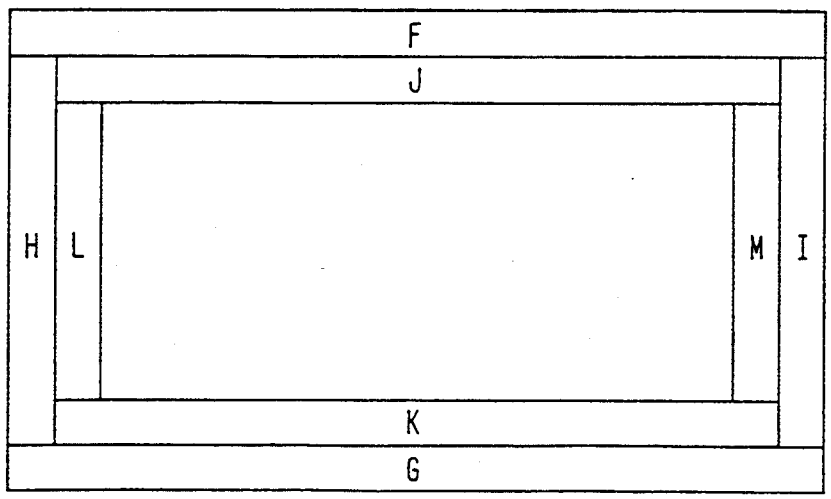
FIG. 20 illustrates a framing operation in accordance with the invention.

As the minimum feature size of a pattern is reduced below one-half of the scattering radius, it would be generally considered preferable to extend the intelligent partitioning by a process referred to as framing as a perfecting feature thereof. The framing process allows dosages to be assigned which will be of increased accuracy as the edge of the shape is approached. Framing is essentially a simplified form of sleeving in which large interior rectangles are cut to form four outer rectangles along the four sides of the interior rectangle and a further central rectangle fully bounded by the four frame rectangles, as shown in FIG. 20 forming rectangles F, G, H and I. This process can be repeated to form rectangles J, K, L and M until the total width of the frame exceeds the scattering radius although only two framings of an interior rectangle are generally done. If framing is done to correct exposure dosages of interior shapes, these rectangles are labelled as correctable shapes; otherwise they are labelled as reference shapes. Alternatively, the width of any frame or frames can be altered by increasing spot rectangle width above the optimum e-beam tool focus toward the maxspot size if the scattering exposure contribution is sufficiently regular or uniform. A combination of these two simplification techniques can also be used as dictated by the resulting increase in processing time and required precision of the process. For this reason, an increase in spot rectangle width would be preferable on second and subsequent framings of an interior rectangle. The cutting or partitioning of these rectangles may be done more coarsely than with exterior rectangles since the environment is necessarily less varied because of the surrounding exterior rectangles. Therefore, scanning increments may be larger and the process accelerated accordingly.

Once the frame width reaches or at least closely approaches the maximum scattering distance, there is no reason to further subdivide the interior rectangle and the remaining central rectangle can be assigned a default exposure dose based on a final intended exposure dose or other exposure parameters. Since slight overexposure is tolerable in interior rectangles (from which framing rectangles are cut), some of these shapes may be assigned a default exposure dose corresponding to an average for the area and thus are referred to as reference shapes. As noted above, control of the edges of interior shapes is less critical and a default value can be applied at some point in the framing process. These reference shapes and the dose assigned to them is basic to the determination of the correct exposure dose for surrounding, more critical, rectangles or shapes. These reference shapes may also be cut as may be convenient to reduce searching for neighboring shapes which they may affect. Reference shapes may be cut for proximity correction but only the uncut shapes are stored. The reference shapes are therefore ignored during recombination; the reference exposure dose assigned thereto being used only for dose correction.

As noted above, the intelligent partitioning and the remainder of the process in accordance with the invention can be performed on interior rectangles, such as framing rectangles, if desired and if it is economically advantageous to do so, depending upon the computing power available and the economic considerations involved in the particular pattern and device to be made. If done, the cutting of interior rectangles is preferably nested within increment cutting since the intelligent partitioning process does not include interior rectangle data. However, it is possible to perform framing prior to increment cutting as well with little modification to the process as illustrated in FIG. 19. For example, the intelligent partitioning could be performed on the remaining interior rectangle data stored after initial cutting A01 after "sleeving" the interior rectangles by repeating initial cutting A01 on the remaining data set and proceeding with a repetition of the intelligent partitioning. However, this results in the generation of cut information (e.g. labels) indicating cuts in two coordinate directions which may complicate later recombination of cut rectangles. Therefore, it is considered preferable to perform framing as an incident of increment cutting where framing cuts may be merely discarded as they are made if equal exposure doses are assigned, and while proceeding only in a single coordinate direction.

Figure 7B:
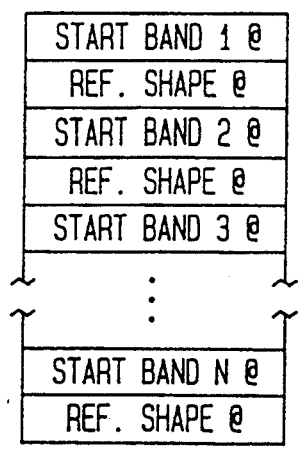
FIG. 7b shows how band records in FIG. 14 are referenced.

It should be noted that the order in which rectangles are processed is determined by the address of the low end of the rectangle if proceeding, as assumed above, from left to right and top to bottom. To impose further order on the process and also to simplify and reduce the time required for the accessing of data, the pattern is also divided into bands as shown in FIG. 14. A data structure for containing records of rectangles belonging to each band is shown in FIG. 7b. Each band, as represented in this data structure contains an entry for the rectangles belonging to the band and the length of the band from the low address in the direction of the length of the band to the end of the band, as represented in storage with an end-of-band (EOB) flag. If no rectangles belong to a band, only an end of band flag will be stored. A sufficient number of bands are preferably provided to extend beyond the pattern by several bands which, together, exceed the scattering distance in order to provide a more consistent search pattern during the search for neighboring shapes. A rectangle is treated as belonging to the band in which its upper edge falls, although this is also an arbitrary convention. The height of a band is selected as an integral power of two multiple (e.g. eight, as illustrated) of the basic increment reproducible by the e-beam tool so that all rectangles belonging to a band can be accessed by using the most significant bits of the beginning address of the band and addressing the band by the uppermost address contained therein.

Within each band, shapes are sorted by their low address corners (e.g. x and y within x).

To simplify this process, a convention of assigning addresses from bottom to top in the pattern and numbering the band from top to bottom is preferably adopted. The band which is termed the main band is the band currently being processed and such processing will begin with the first band which contains shapes (band 4, as illustrated. By the time shapes are sorted and stored into bands, they have already been subdivided based on intelligent partitioning or increment cutting or both. By storing these cut shapes into bands, it is easy to determine the maximum number of bands required to correct all shapes within the main band. Searching for neighbors and recombination are also expedited thereby.

To minimize searching for neighbors of a given shape/rectangle in each band, the process steps from shape to shape along a primary or current rectangle to find neighbors in the order of increasing addresses until a shape is found that is beyond the scattering radius. In adjacent bands, the process steps from shape to shape beginning with the lowest addressed shape that affected the previous primary shape until a shape is found that is within the scattering distance, causing cuts to be made, or a shape is found that has an address which is beyond the scattering radius from the end of the primary rectangle. This process is repeated, accumulating a measure of the mutual scattering exposure effects, until an end-of-band marker is found. Once the process has been completed for a particular band, lower numbered bands (e.g. containing higher addresses) need not be further considered because all necessary data concerning scattering effects will have already been accumulated.

During this neighbor search and dose correction assignment, the tagging or labelling of shapes which was generated when the rectangles were cut during both intelligent partitioning and increment cutting is maintained. In this regard, it is to be recalled that intelligent partitioning was performed only on exterior rectangles, such as sleeving and framing rectangles and that some of these rectangles could be of substantial length, depending on the environment thereof. Also, these exterior rectangles, by definition, are of only a maxspot or optimum focus dimension in width. Therefore, cuts within these exterior rectangles will be made in only one direction (e.g. for horizontal rectangles the possible labels reflecting cuts are not cut, cut right, cut left) and form an ordered list, which may be followed during recombination after exposure dose assignment. This label is essentially a recombination code which indicates the existence of an adjacent rectangle for possible recombination and indicates the direction (to the right or bottom) where it is to be found. All shapes above and to the right will already have been processed, reducing the number of shapes to be searched for and possibly recombined when equal exposure doses have been assigned to adjacent rectangles. It should also be noted that the data structure of FIG. 7a is only used during the intelligent partitioning process and is discarded at the completion thereof. However, the cut information contained therein is saved or regenerated with information on all other cut shapes in the pattern during the process of sorting the shapes cut during both intelligent partitioning and increment cutting in the formation of the data structure of FIG. 7b in which bands contain entries for cut shapes.

For example, as will be discussed in greater detail with regard to FIG. 17, for recombining of cut shapes based on assigned exposure dose, each band can be searched for abutting shapes with matching exposure doses. If the shape is not cut on the high side of either the x or the y direction, it can simply be written to an output list. If it is cut, the band table which points to the sorted shapes can be followed, recombining if the doses are the same until a different dosage assignment is found. Whenever an unmatched dose is encountered, the original shape or the combined shapes are written to the output list and the process proceeds with the following shape. This process can be done for cuts made along the vertical extent of a shape by stepping from band to band.

In order to describe the intelligent partitioning process in greater detail and to convey an increased understanding of this aspect of the invention the following pseudocode is provided. References to the flow chart of FIG. 15 are included in angle brackets. Portions of FIG. 15 corresponding to steps A01 and A02 of FIG. 19 are also indicated therein.

- Exterior rectangles are sorted and cut (in y direction only) to an empirically determined fraction of the scattering distance or range for assignment into bands as described by the proximity correction cutting and sorting <1502>.
- Do for each rectangle in each band <1504>;
    - IF (all rectangles in all bands have been processed) then leave loop <1506>;
    - ELSE
        Get next rectangle (P-RECT) <1508>
    - IF (P-RECT is smaller in its larger dimension than inputted minimum partition size) <1510> THEN DO;
        - No partitioning attempted on this rectangle
        - Output P-RECT without cutting <1512>
        - Iterate loop <to 1504>;
      END;
      ELSE <1510>;
- Find all nearby neighbors (exterior rectangles within a specified scatter range) of P-RECT <1514>
- Store as first entry in cut-table either XS as low PT, XO as high PT of P-RECT if P-RECT is horizontal or YS as low PT, YO as high PT if P-RECT is vertical - in either case store scatter range +1 in distance <1516>,
- Neighbor loop <1520>;
  DO for each nearby neighbor of P-RECT <1518>;
    - P-NEIGH = next neighbor;

-continued

```
        Find the neighbors end PT
        effect on P-RECT -if (P-RECT
        is horizontal) end PT effect
        is as follows <1522>
        (Note: Same approach is used
            when P-RECT is vertical
            except P-NEIGH's YS, YO
            values are used):
        IF (P-NEIGH.XO<=P-RECT.XS|P-
        NEIGH.XS=>P-RECT.XO)|(P-
        NEIGH.XS<=P-RECT.XS & P-
        NEIGH.XO>=P-RECT.XS) then
   o      No end PT effects are stored
        ELSE DO;
          IF  P-NEIGH.XS<P-RECT.XS THEN
              LOW_PT = P-RECT.XS;
              ELSE
              LOW_PT = P-NEIGH.XS;
          IF  P-NEIGH.XO>P-RECT.XS THEN
              HIGH-PT = P-RECT.XO;
              ELSE
              HIGH-PT = P-NEIGH.XO;
          END;
   o    Find distance between the closest edge
        (left, right, top, bottom) of P-NEIGH to
        P-RECT. (Distance)
   o    Find the first entry in cut-table that
        spans all or part of the calculated LOW-
        PT, HIGH-PT of this P-NEIGH.
   o    A new entry in cut-table will be added
        to contain part or all of the segment
        between LOW-PT and HIGH-PT if distance
        is less than any cut-table-entry
        distance of an entry in cut-table
        between LOW-PT and HIGH-PT. Existing
        entries in cut-table are modified or
        deleted if part of (LOW-PT, HIGH-PT,
        DISTANCE) is closer to P-RECT than that
        entry. Adjacent entries in cut-table
        with the same distance value are merged
        <1524>.
        END; /* END NEIGHBOR LOOP*/
     /* At this point all of P-RECTs neighbors
     effects have been stored in cut-table -- the
     entries in cut-table represent the possible
     partition segments of P-RECT */
   o    Process through cut-table, generate cut
        tags (preferably coded by numeric 0-15
        for types of cuts and reference shapes)
        and merge or adjust the low point or
        high point of any entry of a size less
        than a "sliver" dimension with adjacent
        entries to increase the size of any
        "sliver" size entry.
   o    Output the adjusted entries in cut-table
        as partitioned rectangles of P-RECT. if
        first or last entry of cut-table is
        greater than an inputted end-cut-size
        then partition that start or ending
        entry into a end-cut-size partition and
        the remainder <1526, 1512>.
     END; /* End do for each rectangle in each
  band*/
     /* The output rectangles of intelligent
     partitioning become the input rectangles for
     increment cutting for the proximity
     correction modules. */
```

At this point in the process, the rectangles resulting from intelligent partitioning are further subdivided by increment cutting which is, itself, well-known in the art. It is considered preferable to also maintain these further cuts in the band table used during intelligent partitioning in order to facilitate recombination in a later process once the exposure dosages for each rectangle are calculated.

Figure 16:
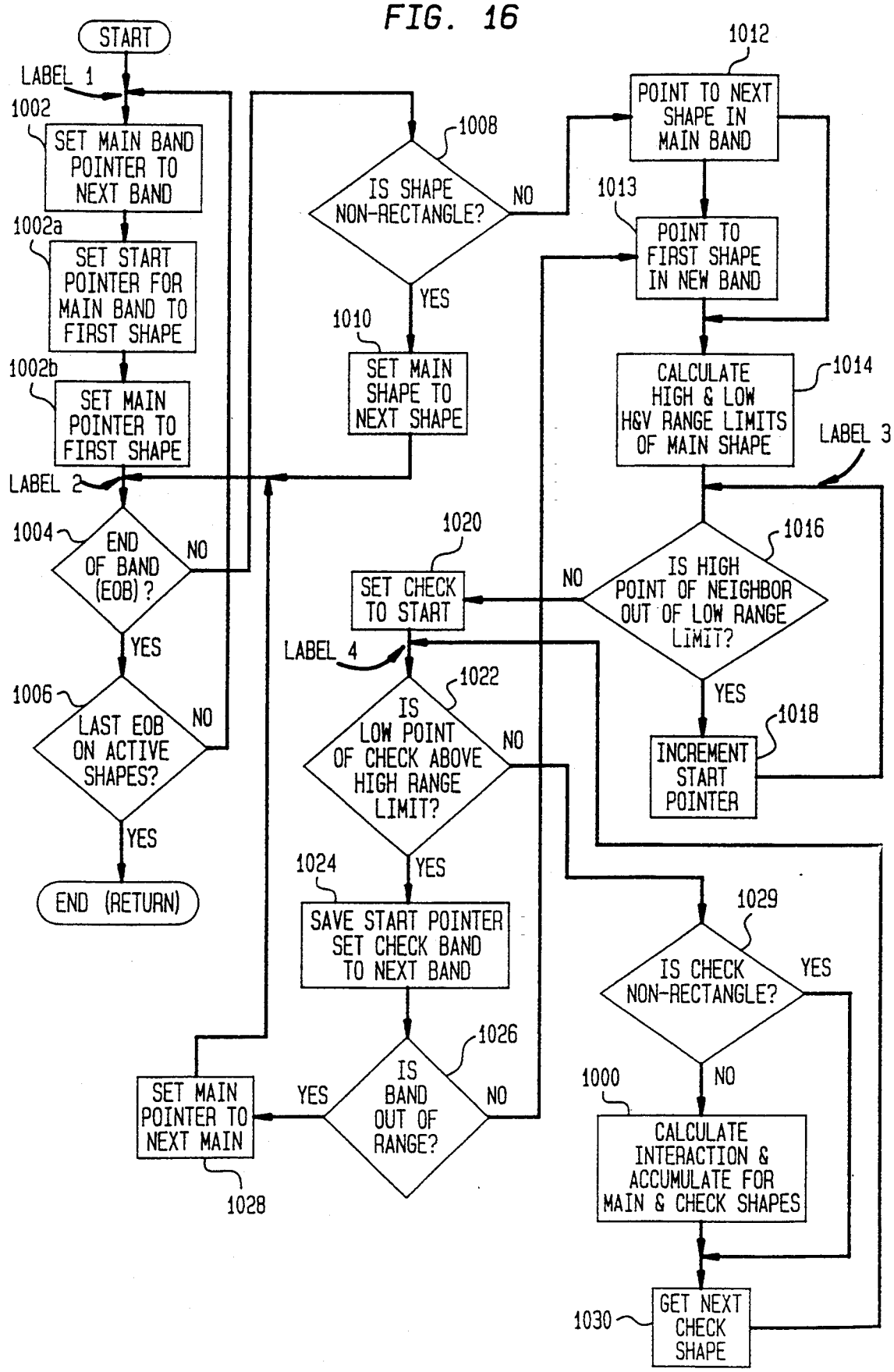
FIG. 16 is a detailed flow chart of subroutine 710 of FIG. 6.

FIG. 16 is basically a platform for a proximity correction algorithm, generally indicated at 1000. As indicated above, the particular proximity correction algorithm used is unimportant to the practice of the invention other than for the requirement that the proximity correction algorithm must calculate a dose correction based on a distance separation between shapes. The platform consists of a hierarchical plurality of loops which correspond to the data organization already established by the sorting and organizing functions of the intelligent partitioning process. The bands are preferably processed in descending order and, within each band, shapes are processed in X-ascending, Y-descending order based on the address of the upper left corner of each shape. As noted above, this allows the accumulation of information as the process proceeds from band to band and previously processed bands need not be further considered.

The process illustrated in FIG. 16 is repeated in its entirety, beginning at 1002 for each band of the pattern by incrementing a band pointer and initializing the start pointer (1002a), which will be incremented to find neighboring shapes, and a main pointer which identifies the shape for which neighbors are sought (1002b). At the beginning of each iteration, a test 1004 is made for an end-of-band marker which will cause branching to 1006 for repetition for a next band, looping to 1002, or ending of the process. Assuming that the end of the main band has not been reached, a further test 1008 is made to determine if the shape is correctable (e.g. a rectangle). If the shape is not correctable, the main pointer is incremented at 1010 and the process loops back to 1004. In the preferred arrangement, however, all shapes are approximated by rectangles and this test will always be satisfied. An exemplary arrangement and methodology for this approximation of shapes with rectangles is disclosed in U.S. patent application Ser. No. 07/736,654, filed Jul. 26, 1991 now U.S. Pat. No. 5,251,140, and which is hereby fully incorporated by reference. In accordance with this procedure, non-rectangular shapes are preferably approximated with a rectangle of equal area (e.g. a proxy shape). The calculated exposure dose for the approximating rectangle is then applied to the non-rectangular shape.

Assuming the shape to be a correctable rectangle, the process proceeds to a band loop including 1012, 1013, 1014, 1016, 1018, 1020, 1022, 1024 and 1026. After setting a pointer to the next shape in the main band (1012) or pointing to the first shape in a new band (1013) when a neighboring band is completed, this band loop calculates range limits for comparison 1014 and looks at shapes in the main bands (in 1016, 1018) or in bands (initialized at step 1020) subsequent to the main band. Therefore, when a band is reached where no part of the band (which is implicit in the band address) is within the range of the current main band (determined at 1026), all shapes relevant to the main shape will have been processed in the relevant subsequent bands.

Before this point is reached, however, the process can branch 1022 to the proximity correction algorithm 1000 for calculating, adjusting and outputting dose values for the shape in the main band, looping to 1022 to accumulate corrections based on a sequence of all neighboring ("check") shapes within the calculated range. That is, within a band, if the check shape is a rectangle, as determined at 1029, the proximity correction algorithm is applied and the correction is accumulated at 1000. If the shape is not a rectangle and, hence, correctable, the proximity correction process is bypassed. Then the check shape pointer is incremented and the process loops back to 1022 for determination if the next check shape is within a range where proximity correction should be performed.

It is possible that a portion of the band will be within the scattering distance or range of the main band but that a shape within it will not. In this case, branching will cause looping through 1016 which will call the next shape for processing. Out-of-range shapes within the band will be detected at 1022 and cause branching to 1024 and the process for that main shape will terminate when the next band, indicated by a check band pointer which is incremented at 1024, is found to be out of range at 1026. Since the shapes are stepped through in Y-descending order, the first shape reached within a band which is out of range of the main band will indicate that no further processing of bands need be done for the current main band, whereupon the main band pointer is incremented (1028) and the process returns to step 1004. It should be noted that this step (1026) is the last of only three numerical range comparisons which are done in the process of FIG. 16. Branching at 1016 rapidly steps through shapes in a band which are not within the scattering range of a main shape (e.g. the high point of the neighbor is not sufficiently close to the low point/address of the current main shape). Then, branching at 1022 occurs at the first shape in the band which is out of range above the high point of the current main shape. Similarly, branching at 1026 terminates stepping through bands at the detection of a band which is out of range. Therefore, the process can be carried out at extremely high speed based on the distance value 760 for each cut rectangle which is carried in the cut table entry. The looping sequence assures that all mutual effects of all possible pairs are accumulated. When the process has been carried out for all bands, complete, cumulative exposure dose values will have been calculated for all rectangles in the pattern or pattern portion contained within the field of the bands as illustrated in FIG. 14.

The pseudocode corresponding to FIG. 16 is as follows, with reference numerals provided in angle brackets:

```
Label 1:
    Set main band pointer to the next band <1002>
    Set start pointers for main and following
    bands to first shape in band <1002a>
    Set main pointer to first shape in main band
    <1002b>
Label 2:
    Is this EOB <1004> then
        Is this the last EOB on active shapes
        <1006> then
            Return
        Else
            Go to Label 1 <1002>
    Else
        If main shape is a non-rectangle <1008>
        then
            set main shape to the next shape
            <1010> in the main band
            go to Label 2 <1004>
        Else
            Set start to next after main <1012>
            Calculate HIGH & LOW Horizontal
            range limits <1014> and Vertical
            range limits of main shape
Label 3:
    If start Hi is out of LOW range of
    non_rect <1016> then
        Increment start pointer <1018>
        go to Label 3 <1012>
    Else
```

```
        Set check to start <1020>
Label 4:
        If Check LOW is past high range <1022>
        then
            Save start pointer <1024>
            Set check band to next band
            If band is out of range <1026>
            then
                set MAIN pointer to next
                main
                go to Label 2
            Else
                Use start for this band
                go to Label 3
        Else
            If check non_rect then
            Else
                calculate interaction <1000>
            get next check rectangle
            go to Label 4
END
```

Figure 17:
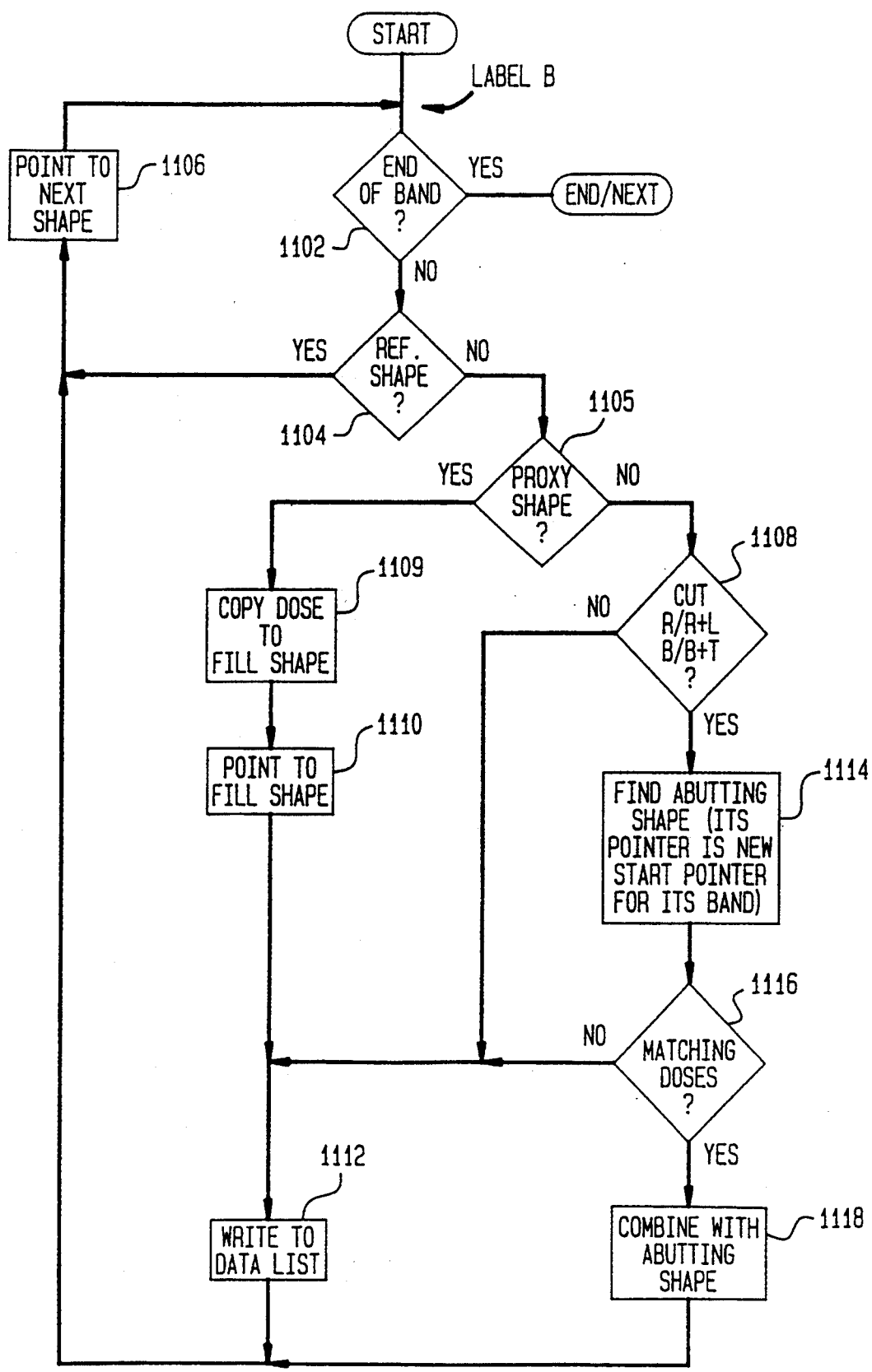
FIG. 17 is a detailed flow chart of subroutine 712 of FIG. 6.
Figure 18:
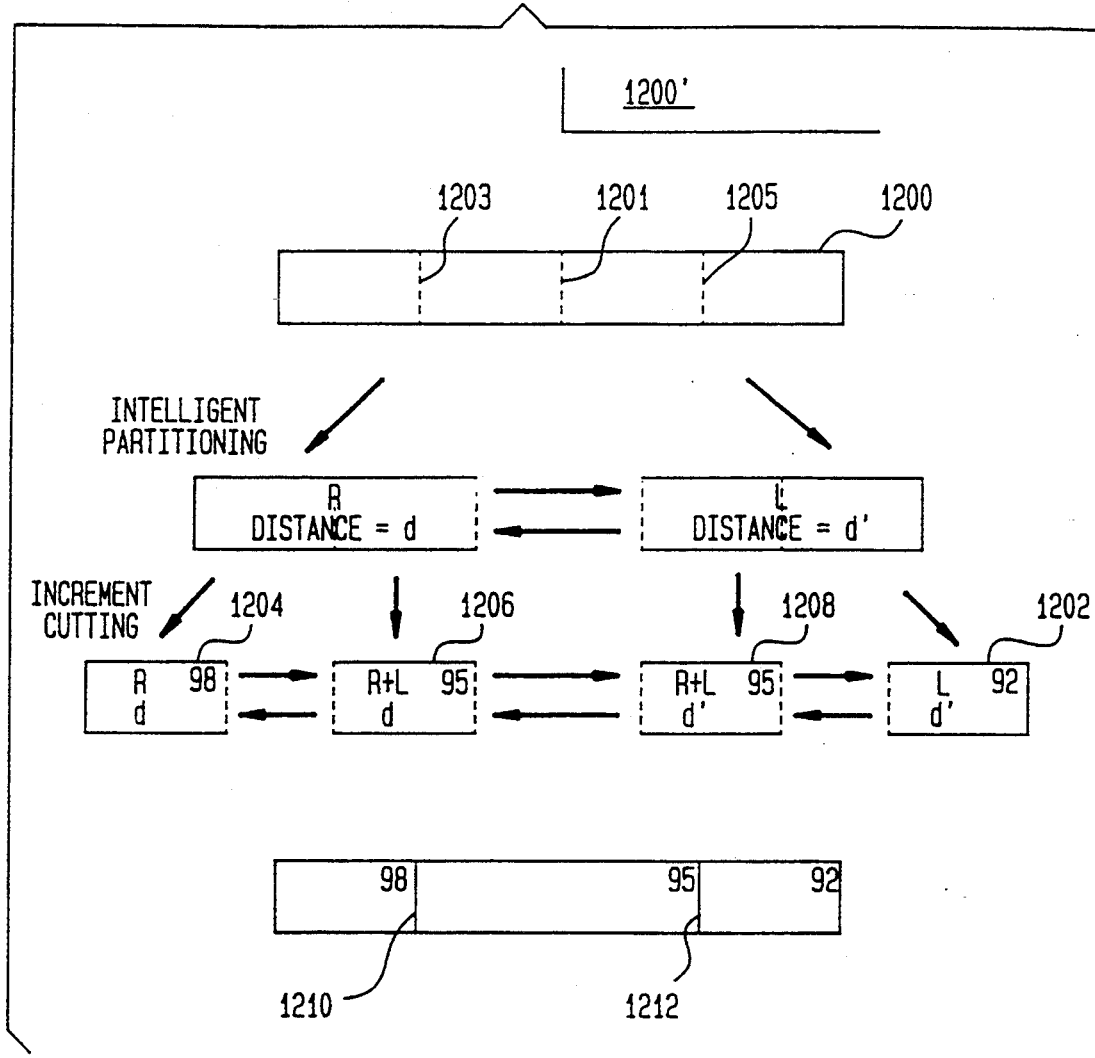
FIG. 18 illustrates the function of the subroutine of FIG. 17.

Referring now to FIGS. 17 and 18, a subroutine is shown for reducing the number of rectangles which must be separately produced with spot rectangles. FIG. 17 shows only the processing for a single band and must be repeated for all bands of the pattern. This branch for repeating or ending the process is done at 1102 in response to detection of an end-of-band flag or marker. Steps 1104, 1105 and 1108 evaluate the types of shapes and types of cuts, if any, which have been made to produce each rectangle. If it is determined at 1104 that the shape is a reference shape and no cuts were made, the reference shape will receive a default dose and no further processing of the shape need be done. Therefore, the pointer is incremented at 1106 and the process loops to 1102. If the shape is not a reference shape but, instead, a proxy shape which is detected at 1105, the calculated dose is copied to the actual shape approximated by the proxy shape at 1109, a pointer is set (1109) to the address of the actual shape ("fill shape") and the dose for the actual shape is written to the data list at step 1112.

If neither a reference shape nor a proxy shape is detected, the shape is a rectangle which is either cut or uncut. Of course, if the shape is uncut subsequent to intelligent partitioning no recombination is possible since intelligent partitioning is done at points where the environment changes and it is assumed that matching doses will not be present to allow recombination. It will be recalled, in this regard, from the discussion of FIGS. 8–13 that some recombination was carried out based upon matching distances. Likewise if the shape is cut only at the top or left (e.g. in the direction of the low address), the shape will be the last in the ordered list of cuts and recombination will have been completed. In either case, the shape and dose may be immediately written to the data list.

Accordingly, step 1108 need test only for cuts in the direction of increasing horizontal and vertical addresses and, if such cuts are found, the abutting shape is found in step 1114 by following the ordered list of FIG. 7b containing some of the data originally generated for the ordered list of the data structure of FIG. 7a in which the pointer for the abutting shape will be the new start pointer for its band. If matching doses are found for the current shape and the abutting shape at step 1116, the current shape and the abutting shape are combined at 1118 and the process loops to step 1102, incrementing a pointer to the next shape at step 1106. (It should be noted that recombination will effectively destroy the data entry in the ordered list corresponding to the "next" shape and a new "next" shape must be specified by incrementing the pointer at 1106. This loop will continue until a branch at 1108 is caused by a shape which is cut only at the top or left (1108) or recombination is not possible due to a difference in calculated doses (1116). If an ordered list of cut shapes is being followed, the ordered list will not contain reference shapes or proxy shapes and neither tests 1104 nor 1105 will be satisfied). Failure of tests at either 1108 or 1116 indicates that a cut should remain. Recombination will then be complete for that shape and the shape can be written to the data list at 1112.

In summary, if a shape is a proxy shape, that shape may be immediately written to a list of output rectangle data. Similarly, if the cut was only on the left (as in rectangle 1202 of FIG. 18) or top, in the preferred convention, it is known from the processing order that no other shapes can be combined with it and the shape can also be directly written to the output. If no cuts are present or cuts in more than one coordinate direction, as in cuts made in interior rectangles, it can be deduced that the shape is either not a rectangle or not an exterior rectangle. Accordingly, the shape is assigned as a reference shape, if not done earlier. A reference dose also is assigned (together with recombination based on flags or other data, as discussed above) and written to the output.

If types of cuts are found that indicate recombination may be possible, the band in which the adjacent rectangle falls is determined. That band is then looped through to find the corresponding shape and the exposure doses computed by the proximity correction algorithm are compared. If the doses do not match, at least within a given range, recombination is not possible and the process branches to 1106 to output the rectangle. If the doses match, the rectangles are recombined.

The process then loops to 1102 but without outputting the shape being processed (now, the combined rectangle). The cuts, if any, remaining in regard to this combined rectangle may indicate, when tested at 1108, in a later iteration, that no further recombination is possible and the process would branch at 1108 to 1109, 1110 and 1112 to write the combined shape to the output data list. On the other hand, test 1108 may indicate that further recombination is possible and the process of following the forward pointer to the abutting rectangle and a comparison of exposure doses would be repeated, causing further recombination until no further cuts or an end rectangle is found or a non-matching dose causes the combined rectangle to be written to the output.

In the preferred embodiment of the invention, the pseudocode for carrying out recombination as generally illustrated in FIG. 17 is as follows:

```
NEW SHAPE:
    If shape is reference shape then go to
GET_NEXT
    Else
        If shape is cut on High_x then
        |do
        |   Move check pointer through
        |       following shapes
        |   until the abutting shape is
        |       found
        |   If doses match then
        |   |do
        |   |   Extend the abutting shape to
        |   |       contain the
        |   |   MAIN shape
        |   |   Move MAIN pointer
        |   |       to the next
        |   |           shape
        |   |   Go to NEW SHAPE
        |   |end
        |   |else;
        |end
    Else /* If shape is cut on High_x then...
        else */
        If shape is cut on bottom then
        |do
        |   Calculate which check band
        |       contains the
        |       abutting shape
Label B:     Use that band's start pointer
        |
        |   If start shape begins to the
        |       left of MAIN
        |       shape then
        |   |do
        |   |   Increment the start pointer
        |   |   Go to Label B
        |   |end
        |   |else;
        |   |Set the check pointer to the
        |       start pointer
        |   Move the check pointer through
        |       the band until
        |       the abutting shape is found
        |   If doses match then
        |   |do
        |   |   Extend abutting shape to
        |   |       contain the MAIN shape
        |   |   Move MAIN pointer to the
        |   |       next shape
        |   |   Go to NEW SHAPE
        |   |end
        |   |else;
        |end
    Else /* If shape is cut on bottom then
        If shape is approximation to non-
            rectangular shape
        then do
            Transfer dose to that shape (which
                is next in band)
            Move MAIN pointer to that non_rect
                shape
            and
            Else;
        Place shape in output list
Get_next:
        Point to next MAIN
        If end-of-band then
        do
            Point MAIN BAND pointed to NEXT
                BAND
            Set to the first shape in the band,
    START POINTERS
            for MAIN and for all bands below which
            could contain shapes which abut a shape
            in the MAIN band
            Set MAIN pointer to the first shape in
            the new MAIN band end
        Else; /* If end-of-band */
        Go to new_shape
```

In summary and with reference to FIGS. 18 and 19, the process of the invention causes subdivision of a rectangle 1200 first by intelligent partitioning (A02) at cut 1201 due to shape 1200' and further division by increment cutting (A03) at 1203 and 1205. The cut rectangles are maintained in a linked list as indicated by double arrows similar to FIGS. 9–13. Labels indicating the types of cuts (e.g. L, R, L&R) made are implicit in the cut table entries or can be separately maintained, if desired. The cutting points specified by increment cutting also generates proximity data (e.g. d, d') in one coordinate direction which is maintained through the increment cutting process. Recombination of rectangles can be done at this point if this proximity data is the same for two adjacent rectangles, as shown in FIG. 12. The proximity data in the other coordinate direction is immediately available as the address of neighbor shapes found at 1014 of FIG. 16 and the proximity correction algorithm can compute (A04) proximity effects based on actual distances which can be derived from the orthogonal distances. Thus, for example, the proximity correction algorithm may assign a dose value of 98 (arbitrary units) to rectangle 1204, 95 to each of rectangles 1206 and 1208 and a dose of 92 to rectangle 1202. The type of cut information is available from either the syntax of the linked list or chain of rectangles or separate storage of the same and recombination of rectangles such as 1206 and 1208 can be done when the doses compare favorably. The remaining cuts are thus shifted to optimal positions but remain based on the environment of the rectangle 1200 which is affected by shape 1200'.

As is evident from FIG. 19, the results of intelligent partitioning and the increment cutting are reduced by recombination based on available data and stored to memory in the smallest volume which preserves the information of interest. Specifically, the cuts based on environment are preserved at the conclusion of intelligent partitioning and the environment-based cuts form ends of shapes during increment cutting and thus are candidates for final cuts even though the process has only considered feature separation distances in a single coordinate direction. Since the increment cutting proceeds from the cuts made by intelligent partitioning, incremental cuts spaced at predetermined increments from the intelligent partitioning cuts assures that the remaining final cuts at changes in exposure dose will also be positioned with resolution equal to the cutting increment. The position of the final cuts will also be optimized for the proximity correction algorithm used since recombination after increment cutting is based only on differences in exposure dose assigned by the proximity correction algorithm. The storage of data will also be the minimum volume of data which preserves the exposure dosage computed by the proximity correction algorithm.

Thus, by comparing FIG. 18 to FIGS. 2-5, it is seen that the invention provides environment-based cutting of shapes with adjustment of cuts to optimal positions while maintaining a minimum of data to be processed at all times. Since the steps of the process can be performed at very high speed, the invention provides greatly improved proximity correction at a throughput which is compatible with production processes.

It should be noted that the above discussion of the invention is somewhat idealized by being limited only to rectangles while some variations of the practice of the invention could process other shapes which can be approximated by rectangles or shapes other than rectangles which need not be decomposed. While such a variation does not result in particularly significant changes being made in the process as discussed above, the following definitions and pseudocode are provided in the interest of completeness of description of a preferred embodiment of the invention.

Shape: Typically, but not restricted to: rectangle, right-isosceles triangle, trapezoid, and circle.

Special Shape (or non-rectangle): In the illustrative implementation, any shape except a rectangle which, in the illustrative implementation, has, by far, the simplest, quickest computation of scattering effects of one shape on another. Special shapes, in the illustrative implementation include right-isoceles triangles oriented so that one or more edges are parallel to an axis of the coordinate system, and a limited set of parallelograms.

Proxy-Shape: A rectangle which approximates an associated special-shape in area and which is centered near the center of the special-shape. It substitutes for the special-shape in all calculations of scattering effects.

Ref-Shape: A "reference" shape which is a subdivision of a larger shape or the whole of one, which has a predetermined exposure. Its presence is required for the determination of the effects of scattering from it on shapes whose exposure is being determined.

Main-Shape: The shape in the list which, when first pointed to, has the accumulation of scattering effects from all neighbors which precede it in the list, but none of those that follow it. It remains the main-shape until scattering effects have been determined with all neighbors which follow it in the list, except that special-shapes are skipped.

Check-Shape: A shape which comes after the main-shape in the list of shapes to be processed.

Start-Shape: The first shape in a band to be considered as a potential neighbor to the main shape. Its identifying pointer moves along the list for the band, according to the shape's location relative to the current main-shape.

End-Of-Band-Marker: A record that has the same format as that of a shape but has an identifying flag, and a very large coordinate along the length of the band (X, in the illustration) so that it will not be a neighbor to any "real" shape.

Band: An ordered list (preferably physically ordered, but, optionally, a linked-list) of shapes having, except for a predetermined number of low-order bits or digits, a common coordinate of a common extremity (e.g., the corner of rectangle having the low y-coordinate). Within a band, the order is by the other coordinate of the same point and, in case of ties, then, by the value of the first coordinate. Bands are referenced from a list of pointers to the first shape in the band, or, if the contains on shapes, to an end-of-band marker.

Scattering-Limit: The distance at which consideration of detailed computation of shape-to-shape scattering is no longer needed (some consideration of scattering among aggregates of shapes may still be appropriate). There are three relevant limits used in the method: Those on either side of the rectangle (in the "X" direction in the illustrative implementation) and the one in the direction of neighbors whose effects remain to be considered. Limiting functions may also be used when the two shapes under consideration are not directly opposite each other in any direction. This will be done when the computation of interaction is costly relative to the cost of checking the limiting function.

Limiting Function: An approximation or calculation of boundary relative to a shape or to one or more of its extremities. The simplest is a 45 degree line which passes at a minimum distance from a point of concern such as the corner of a rectangle. It is of the form—

$$X+Y=X\_corner+Y\_corner+(minimum\_spacing*1.4)$$

where
minus signs are substituted for plus as appropriate to cover the two orientations of the lines and the two directions from the point depending on the location of the point relative to the rest of the shape.

X_corner & Y_corner are the coordinates of the extremity. Minimum_spacing is the closest two shapes can be without it being necessary to consider mutual effects of scattering individually.

Which side of the line a point is on can be determined by whether the sum of its coordinates is greater or smaller than the value on the right side of the equation.

```
Do while main-band is not last containing shapes:
    Do while main-shape is not end-of-band
        marker:
        If main-shape has a proxy shape then do
            nothing.
        Else
            calculate scattering from and on other
            nearby shapes: calculate the limits of
            scattering to be considered, relative to the
            main shape
            Do while band-boundary is less than the out-
            of-band scattering limit:
                If ref-band is first band then point to
                next shape after main-shape as first
                other-shape.
                Else
                    Do while (the high border of the start-
                    shape is less than the in-band low-limit
                    for the main shape) or (start-shape has
                    a proxy shape):
                        Point to the next start-shape.
                    End do.
                    Point to start-shape as first other-
                    shape.
                Do while (the low border of the other-
                shape is less than the high-limit for the
                main shape):
                    If (other shape has a proxy shape) or
                    ((Main-shape is ref) & (other-shape is
                    ref)) then do nothing.
                    Else
                        If (Y-low of other-shape is greater
                        than Y-high of main-shape) and ((X-
                        high of other-shape is less than X-low
                        of main-shape) and ((X-high of other-
                        shape plus Y-low of main-shape) is
                        less than the low-X-function)) or ((X-
                        low of other-shape is less than X-high
                        of main-shape) and ((X-low of other-
                        shape plus Y-high of main-shape) is
                        greater than the high-X-function) then
                        do nothing.**
                        Else
                            Calculate mutual scattering effects
                            Add values to sum field
                            of data for the shape.
                    Point to next other-shape.
                End do.
                Point to beginning of next band, as
                pointer to start-shape.
            End do.
        If main-shape is ref then do nothing.
            Else
                Calculate exposure level, based on
                scattering applied
                If main shape is a proxy shape
                then store value in a field in
                the special-shape's record,
                Else
                    Store value in a field in its record.
            Point to next main-shape in the band.
            End else.
    End do.
    Call recombine.*
    Point to band after main-band as new main-
    band.
    End do.
End.
```

*Recombine is preferably done here if the data storage system has it at a level that does not have the capacity to hold all of the shape data being processed. Otherwise, optionally, it may be done as a separate step in the preparation.
**The use of the limiting function depends on the relative computational costs and should be used only when a net gain can be realized. An example is given here for illustrative purposes.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A lithographic method of partitioning shapes included in an exposure pattern, said shapes having a plurality of abutting edges, said method including the steps of
   dividing said exposure pattern into shapes including a plurality of interior and exterior rectangles, said plurality of exterior rectangles having a predetermined maximum width and arbitrary length,
   subdividing at least one of said plurality of exterior rectangles at a location along its length having a same horizontal or vertical address as a boundary of a shape in said exposure pattern which is within a scattering distance of said at least one of said plurality of exterior rectangles, and
   storing a description of each of said plurality of exterior rectangles resulting from said subdividing step, said description including at least an address corresponding to said location, said descriptions forming an ordered list in accordance with at least one said address corresponding to said location.

2. A method as recited in claim 1, wherein said exposure pattern is an electron beam exposure pattern to be formed by an electron beam lithography process.

3. A method as recited in claim 1, wherein said description includes data representing a separation distance between said at least one of said plurality of exterior rectangles and said boundary of said shape within said scattering distance.

4. A method as recited in claim 3, including the further step of combining at least two of said plurality of exterior rectangles which are adjacent and equally separated from said boundary of said shape.

5. A method as recited in claim 1, further including the steps of
   increment cutting, principally at regular intervals, in accordance with said ordered list, of each of said plurality of exterior rectangles for which descriptions have been stored by said storing step, and
   maintaining a description of types of cuts made by said increment cutting step in an ordered list.

6. A method as recited in claim 5, including the further steps of
   computing a mutual exposure correction for each shape resulting from said increment cutting step based upon a separation distance between each said shape resulting from said increment cutting step and every other shape resulting from said increment cutting step which is within a scattering distance of each said shape, and
   accumulating said mutual exposure correction for each said shape resulting from said increment cutting step.

7. A method as recited in claim 6, wherein said step of computing a mutual exposure correction computes a correction for each said shape and each said other shape having an address within said exposure pattern which is subsequent to an address of said shape.

8. A method as recited in claim 5, including the further steps of
computing a mutual exposure correction for each shape resulting from said subdividing step based upon a separation distance between each said shape resulting from said subdividing step and every other shape resulting from said subdividing step which is within a scattering distance of each said shape, and
accumulating said mutual exposure correction for each said shape resulting from said subdividing step.

9. A method as recited in claim 8, wherein said step of computing a mutual exposure correction computes a correction for each said shape and each said other shape having an address within said exposure pattern which is subsequent to an address of said shape.

10. A method as recited in claim 1, wherein said subdividing step is performed in address order within said exposure pattern.

11. A method as recited in claim 1, including the further step of dividing said exposure pattern into bands, each said band having a width which is an integral multiple of a distance between consecutive addresses in one coordinate direction of said exposure pattern.

12. A method as recited in claim 11, wherein said integral multiple is an integral power of two.

13. A method as recited in claim 11, wherein said subdividing step is performed in address order within one said band of said exposure pattern.

14. A method as recited in claim 12, wherein said subdividing step is performed in address order within one said band of said exposure pattern.

15. A method as recited in claim 6, including the further steps of
computing an exposure dose for each said shape from said mutual exposure corrections accumulated by said accumulating step,
comparing said exposure dose of each said shape with an exposure dose of an abutting shape, and
combining said shape and said abutting shape if said exposure dose of said shape and said exposure dose of said abutting shape are approximately equal.

16. A method as recited in claim 15, wherein said abutting shape is determined in accordance with said ordered list of cuts made during said increment cutting step.

17. A method as recited in claim 8, including the further steps of
computing an exposure dose for each said shape from said mutual exposure corrections accumulated by said accumulating step,
comparing said exposure dose of each said shape with an exposure dose of an abutting shape, and
combining said shape and said abutting shape if said exposure dose of said shape and said exposure dose of said abutting shape are approximately equal.

18. A method as recited in claim 17, wherein said abutting shape is determined in accordance with said ordered list of cuts made during said subdividing step.

19. A method as recited in claim 6, wherein said step of computing a mutual exposure correction includes approximation with a limiting function.

20. A method as recited in claim 8, wherein said step of computing a mutual exposure correction includes approximation with a limiting function.

* * * * *